(12) United States Patent
Naono

(10) Patent No.: US 9,030,721 B2
(45) Date of Patent: May 12, 2015

(54) MIRROR DRIVING DEVICE AND METHOD OF CONTROLLING THE DEVICE

(71) Applicant: FUJIFILM Corporation, Tokyo (JP)

(72) Inventor: Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 157 days.

(21) Appl. No.: 13/763,478

(22) Filed: Feb. 8, 2013

(65) Prior Publication Data

US 2013/0208330 A1    Aug. 15, 2013

(30) Foreign Application Priority Data

Feb. 14, 2012  (JP) ................................ 2012-029444

(51) Int. Cl.
  *G02B 26/08* (2006.01)
  *G02B 26/10* (2006.01)
  *G02B 26/12* (2006.01)
  *H01L 41/09* (2006.01)

(52) U.S. Cl.
  CPC ............ *G02B 26/10* (2013.01); *G02B 26/0858* (2013.01); *H01L 41/0953* (2013.01)

(58) Field of Classification Search
  USPC .......... 359/199.1, 199.2, 199.3, 199.4, 200.1, 359/579, 824
  See application file for complete search history.

(56) References Cited

U.S. PATENT DOCUMENTS

2004/0125472 A1* 7/2004 Belt .............................. 359/847
2009/0185253 A1* 7/2009 Tani et al. ................... 359/221.2
2009/0255804 A1  10/2009 Naono et al.
2010/0245966 A1* 9/2010 Yasuda ....................... 359/224.1
2012/0033279 A1  2/2012 Furukawa et al.

FOREIGN PATENT DOCUMENTS

JP       11-089254 A      3/1999
JP     2002-221673 A      8/2002
JP     2006-311423 A     11/2006

(Continued)

OTHER PUBLICATIONS

An Office Action; "Notification of Reasons for Rejection," issued by the Japanese Patent Office on Jan. 21, 2014, which corresponds to Japanese Patent Application No. 2012-029444 and is related to U.S. Appl. No. 13/763,478; with English language partial translation.
D. McCormick et al.; 'A Three Dimensional Real-Time MEMS Based Optical Biopsy System for In-Vivo Clinical Imaging' in 'Solid-State Sensors, Actuators and Microsystems Conference, 2007. Transducers 2007. International', pp. 203-208.

(Continued)

*Primary Examiner* — Scott J Sugarman
*Assistant Examiner* — Mustak Choudhury
(74) *Attorney, Agent, or Firm* — Studebaker & Brackett PC

(57) ABSTRACT

A mirror driving device can include: a mirror part having a reflection surface configured to reflect light; mirror support parts formed at portions of the mirror part diagonal to each other; and a first actuator and a second actuator placed so as to surround the mirror part, wherein the first actuator and the second actuator each have a structure in which a plurality of first piezoelectric cantilevers with a longitudinal direction oriented to a direction of a first axis and a plurality of second piezoelectric cantilevers with a longitudinal direction oriented to a second axis are coupled together so as to be folded, and each of the first actuator and the second actuator has one end connected to the mirror part via a relevant one of the mirror support parts and another end connected to a fixing part near the mirror support part to which the one end is coupled.

13 Claims, 16 Drawing Sheets

(56) References Cited

FOREIGN PATENT DOCUMENTS

| | | |
|---|---|---|
| JP | 2008-040240 A | 2/2008 |
| JP | 2009-249713 A | 10/2009 |
| JP | 2009-288800 A | 12/2009 |
| JP | 2010-139691 A | 6/2010 |
| JP | 2011-085677 A | 4/2011 |
| JP | 2013-083769 A | 5/2013 |
| WO | 2010/131449 A1 | 11/2010 |

OTHER PUBLICATIONS

M. Tani et al.; 'A Two-axis Piezoelectric Tilting Micromirror with a Newly Developed PZT-meandering Actuator' in Micro Electro Mechanical Systems, 2007. MEMS. IEEE 20th International Conference (2007) pp. 699-702.

J. Singh et al; 'A Two Axes Scanning SOI MEMS Micromirror for Endoscopic Bioimaging', Journal of Micromechanics and Microengineering 18(2), 025001.

\* cited by examiner

FIG.21

| STRUCTURE | Nb-PZT | Nb-PZT | Nb-PZT | Nb-PZT | Nb-PZT | non-dope PZT | Nb-PZT | non-dope PZT | non-dope PZT | non-dope PZT | Nb-PZT | non-dope PZT |
|---|---|---|---|---|---|---|---|---|---|---|---|---|
| | EXAMPLE 1 | | | | | | EXAMPLE 2 | | EXAMPLE 1 | | COMPARATIVE EXAMPLE | |
| L (μm) | 1500 | 1000 | 1500 | 1000 | 1000 | 1500 | 1000 | 1000 | 1500 | 1000 | 1000 | 1000 |
| t (μm) | 10 | 10 | 5 | 5 | 5 | 10 | 5 | 5 | 10 | 5 | 10 | 10 |
| w (μm) | 200 | 200 | 200 | 200 | 100 | 200 | 200 | 200 | 200 | 200 | 150 | 150 |
| ELEMENT SIZE | 2.7mm×3.2mm | 2.2mm×2.6mm | 2.7mm×3.2mm | 2.2mm×2.6mm | 1.9mm×2.2mm | 2.7mm×3.2mm | 2.2mm×2.6mm | 2.2mm×2.6mm | 2.7mm×3.2mm | 2.2mm×2.6mm | 3.0mm×2mm※ | 3.0mm×2mm※ |
| OPTICAL DEFLECTION ANGLE (°) ABOUT x AXIS@±10 V | 32 | 24 | 90 | 68 | 60 | 16 | 12 | 64 | 47 | 35 | 37 | 18 |
| OPTICAL DEFLECTION ANGLE (°) ABOUT y AXIS@±10 V | 36 | 26 | 93 | 70 | 61 | 17 | 13 | 66 | 49 | 36 | 45 | 19 |
| RESONANCE FREQUENCY f1 (Hz) | 640 | 1380 | 344 | 732 | 761 | 640 | 1380 | 778 | 344 | 732 | 345 | 345 |
| RESONANCE FREQUENCY f2 (Hz) | 860 | 1740 | 430 | 860 | 961 | 860 | 1740 | 858 | 430 | 860 | 1200 | 1200 |
| INITIAL ANGLE (°) OF MIRROR ABOUT x AXIS | 0 | 0 | 0 | 0 | 0 | 0 | 0 | 0 | 0 | 0 | 4 | 2.5 |
| INITIAL ANGLE (°) OF MIRROR ABOUT y AXIS | 0 | 0 | 0 | 0 | 0 | 0 | 0 | 0 | 0 | 0 | 7 | 4 |
| EVALUATION | A | AA | A | AA | AA | B | A | AA | A | A | B | C |

MIRROR DRIVING DEVICE AND METHOD OF CONTROLLING THE DEVICE

BACKGROUND OF THE INVENTION

1. Field of the Invention

The presently disclosed subject matter relates to a mirror driving device and method of controlling the device and, in particular, relates to the structure of a micromirror device suitable for an optical deflector for use in optical scanning and others and technologies for controlling the driving of the micromirror device.

2. Description of the Related Art

A microscanner (hereinafter referred to as a "MEMS (Micro Electro Mechanical System) scanner fabricated by using silicon (Si) microfabrication processing) has a feature of being small in size and having low power consumption compared with a polygon mirror, which is a conventional optical scanning module, or others. For this reason, the MEMS scanner is expected be widely applied from a laser projector to an optical diagnostic scanner such as an Optical Coherence Tomography (OCT).

Among various schemes for driving the MEMS scanner, a piezoelectric driving scheme using deformation of a piezoelectric substance can achieve a large torque per unit area compared with other schemes and uses a simple drive circuit, and therefore has a potential as a scheme allowing a small size and a large scan angle.

However, a piezoelectric actuator not using resonance has a problem of a small displacement. For example, in the field of endoscopic optical diagnosis such as OCT, the scan length on a target to be measured is desired to be at least 1 mm or more (refer to McCormick, D. et. al., "A Three Dimensional Real-Time MEMS Based Optical Biopsy System for In-Vivo Clinical Imaging" in Solid-State Sensors, Actuators and Microsystems Conference, 2007, TRANSDUCERS 2007, International', pp. 203-208). For example, when a MEMS scanner incorporated in the endoscopic probe having a diameter of 5 millimeters (5 mm φ) performs a radial scan on a point 0.5 mm outside the probe, for a scan of 1 mm or more, an optical deflection angle at least 20 degrees or more is required. Achieving such a large optical deflection angle in a single piezoelectric unimorph cantilever is difficult, and some contrivance is required.

As a means for significantly tilting a mirror, a structure has been suggested in which, for example, a cantilever itself is folded a plurality of times to form a meander shape so as to interpose a mirror part and also a movable plate is used for a gimbal structure, thereby achieving non-resonant two-dimensional (2-D) driving (refer to Tani, M., Akamatsu, M., Yasuda, Y., Toshiyoshi, H., "A two-axis piezoelectric tilting micromirror with a newly developed PZT-meandering actuator" in Micro Electro Mechanical Systems, 2007, MEMS. IEEE 20th International Conference (2007) pp. 699-702). In this scheme, a piezoelectric cantilever is folded to allow driving so as to induce bending alternately in opposite directions, thereby expanding displacement. With this, the mirror can be significantly tilted without using resonance.

However, while this structure can achieve a larger rotation angle as the piezoelectric cantilever is folded more times, resonance frequencies of rotation motion and translational motion of the mirror are decreased at the same time. This causes the following problems.

(1) Resonance of the mirror is easily excited by ambient vibration.

(2) When the mirror is driven for rotation with a triangle wave or a sawtooth wave, resonance vibration (sine wave components) of rotation motion is superposed to change a drive response waveform.

In particular, Problem (1) causes fluctuations of the optical path length and a positional shift of a spot during scanning in the case of a use purpose with a lot of environmental vibrations such as a vehicle-mount purpose or endoscopic purpose, and therefore becomes critical in actual use.

Also, with the adoption of the gimbal structure, the device size is increased, and therefore application for endoscopic purposes generally requiring a device size of 3×3 mm or less is difficult. In view of decreasing the size of the device, a non-resonant two-dimensional (2-D) scanner not adopting a gimbal structure is desired. A non-resonant two-dimensional (2-D) MEMS scanner of a thermal bimorph type not using a gimbal structure was prototyped in Singh, J.; Teo, J. H. S.; Xu, Y.; Premachandran, C. S.; Chen N.; Kotlanka, R.; Olivo, M. & Sheppard, C. J. R. (2008), "A two axes scanning SOI MEMS micromirror for endoscopic bioimaging", Journal of Micromechanics and Microengineering 18(2), 025001.

However, the structure disclosed in Singh et al., for example, when the mirror is driven for rotation about an x axis, a reaction force works due to an actuator of another axis not involving driving, and therefore drive efficiency is significantly decreased.

By contrast, a structure as depicted in FIG. 26 has been suggested in Japanese Patent Application Laid-Open No. 2008-040240. This FIG. 26 cites the figure disclosed as FIG. 3 in Japanese Patent Application Laid-Open No. 2008-040240. Adjacent actuators as described above are subjected to bending displacements in opposite directions to accumulate deflection angles for transfer to the mirror, and each have a plurality of cantilevers to be subjected to bending rotation about two axial directions orthogonal to each other, thereby allowing two-dimensional rotation about these axes. According to this structure, in the case of rotation about an axis, a reaction force by an actuator responsible for driving about any other axis does not occur, and therefore the force can be effectively used.

However, the structure depicted in FIG. 26 has the following problems.

When extraneous vibration in a vertical direction occurs, an angular displacement occurs to the mirror due to an inertial force.

Since many cantilevers are folded to obtain sufficient displacement, the resonance frequency is low, and the structure is easily influenced by disturbances.

Since the center of the mirror does not match the center of the device, when the MEMS is installed so that the center of the mirror is placed inside a cylindrical tube such as an endoscope, an approximately doubled space is required.

SUMMARY OF THE INVENTION

As described above, the conventional MEMS scanner has the following problems.

<Problems Regarding Deflection Angle>

[1] The MEMS scanner not using resonance generally has a small deflection angle.

[2] If the deflection angle is increased by, for example, folding the piezoelectric cantilever, the resonance frequency is decreased, the response speed falls down, and noise due to disturbance vibration is dramatically increased.

[3] Also, when a piezoelectric actuator is manufactured by forming a PZT thin film with the use of thin-film manufacturing technology such as sputtering, initial warpage occurs to the actuator due to residual stress of the PZT thin film, thereby causing an initial tilt of the mirror. In particular, this problem is significant when Nb-doped PZT with high piezoelectric performance is used, because the residual stress is high.

[4] When the piezoelectric actuator is activated, if driving applied with DC offset is performed in order to prevent polarization reversal of PZT, an offset occurs to the rotation angle of the mirror. In particular, this problem is serious when Nb-doped PZT with high piezoelectric performance is used, because the polarization reversal electric field is small and therefore application of a DC offset voltage is a requisite.

<Problems Regarding Two-Dimensional Driving>

[5] In the case of the "gimbal scheme" of driving about two axes by using rotationally-movable plates, the element size is increased.

[6] In the case of the conventional structure not using a gimbal structure, if the mirror is rotated about the x axis by an actuator for rotation about the x axis, an actuator for rotation about the y axis is also deformed, thereby receiving a repulsive force. For this reason, the deflection angle is degraded compared with the gimbal structure.

The presently disclosed subject matter was made in view of these circumstances, and has an object of providing a mirror driving device and method of controlling the mirror driving device capable of solving the problems described above.

To achieve the object described above, a mirror driving device according to the presently disclosed subject matter includes a mirror part having a reflection surface that reflects light, mirror support parts formed at portions of the mirror part diagonal to each other, and a first actuator and a second actuator placed so as to surround the mirror part, the first actuator and the second actuator each having a structure in which a plurality of first piezoelectric cantilevers with a longitudinal direction oriented to a direction of a first axis and a plurality of second piezoelectric cantilevers with a longitudinal direction oriented to a second axis not parallel to the first axis are coupled together so as to be folded, and each of the actuators has one end connected to the mirror part via a relevant one of the mirror support parts and another end connected to a fixing part near the mirror support part to which the one end is coupled.

Other embodiments of the invention will be clarified from the specification and the description of the drawings.

According to the presently disclosed subject matter, the mirror part can be tilted with a large deflection angle with the use of a combination of a plurality of piezoelectric cantilevers. Also, if a material with excellent piezoelectric characteristics, such as Nb-doped PZT with a high piezoelectric constant, is used, a large deflection angle can be obtained with a relatively small number of times of folding, and therefore the resonance frequency can be designed to be high. With this, a quick response can be made, and influences due to disturbance vibration can be significantly suppressed. Furthermore, even if flexure occurs to all piezoelectric cantilevers in the same direction due to initial flexure caused by residual stress or offset driving of the piezoelectric substance or other reasons, these displacements are cancelled as a whole, and do not have an influence on the deflection angle and vertical displacement. Also, according to the presently disclosed subject matter, an actuator mirror can be placed in an approximately closest-packed manner, and therefore a decrease in element size can be achieved.

BRIEF DESCRIPTION OF THE DRAWINGS

FIG. 21 is a table including evaluations of devices according to Example 1, Example 2, and Comparative Examples;

DETAILED DESCRIPTION OF EMBODIMENTS

The embodiments of the presently disclosed subject matter are described in detail below according to the attached drawings.

[First Embodiment]

Figure 1:
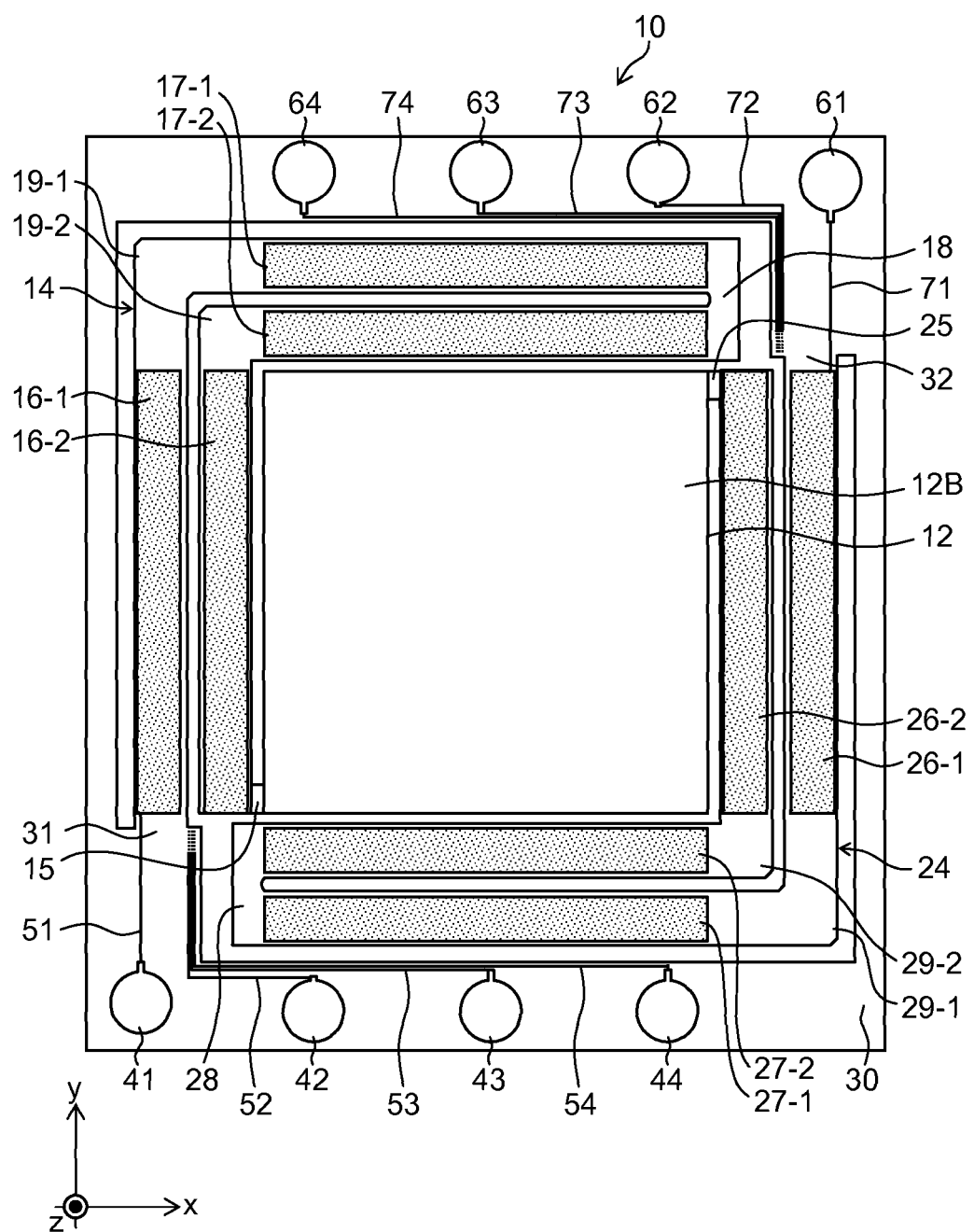
FIG. 1 is a plan view of a MEMS scanner device according to a first embodiment.

FIG. 1 is a plan view of a MEMS scanner device according to a first embodiment.

Figure 2:
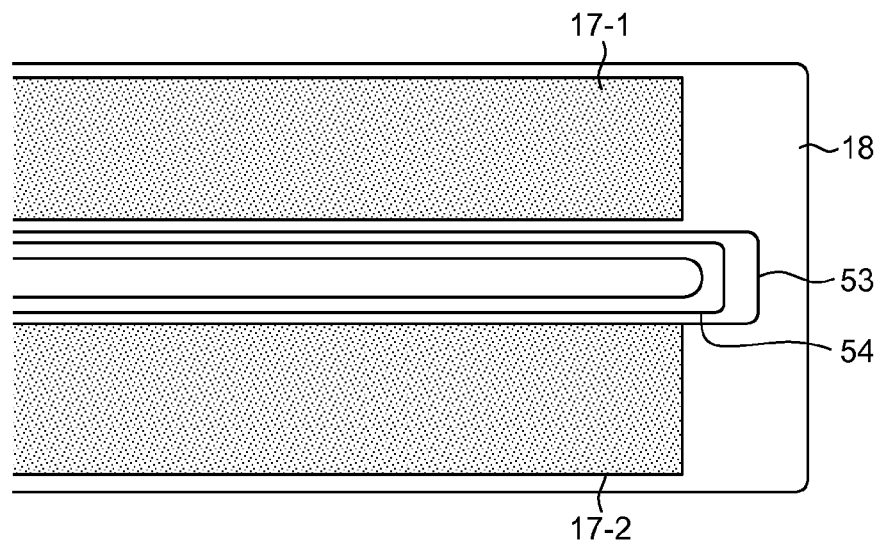
FIG. 2 is a partially enlarged view of FIG. 1.
Figure 3:
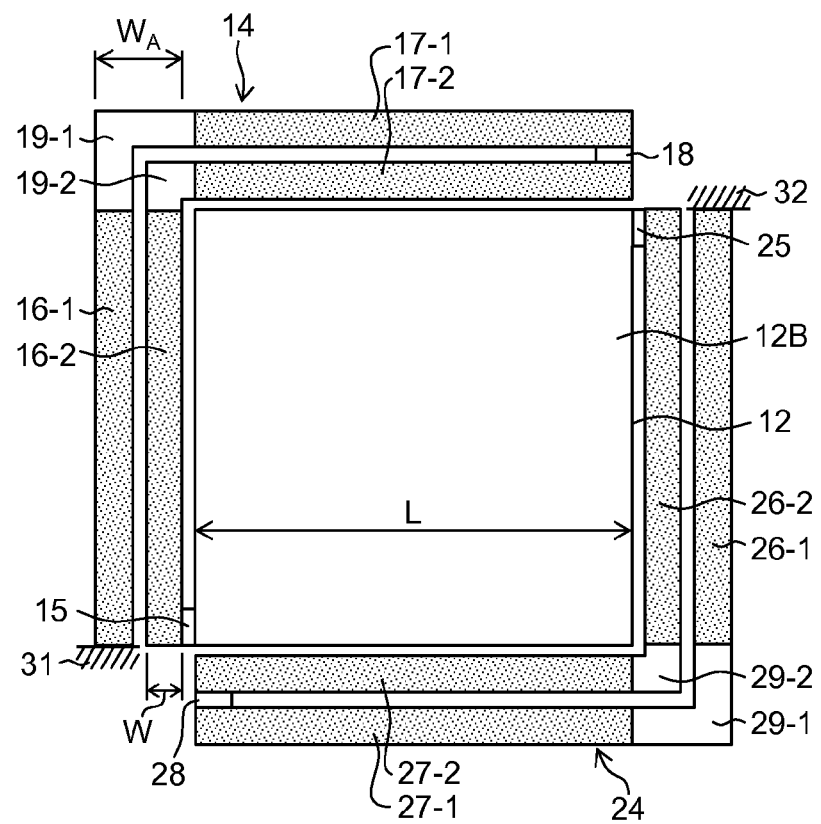
FIG. 3 is a drawing schematically depicting a device structure of FIG. 1.

FIG. 2 is a partially enlarge view of FIG. 1. FIG. 3 is a drawing schematically depicting a device structure of FIG. 1. As depicted in these drawings, a MEMS scanner device 10 (corresponding to a "mirror driving device") according to the present embodiment includes a mirror part 12, two actuators 14 and 24 so as to surround this mirror part 12, and a fixing frame 30 supporting these actuators 14 and 24. At diagonal positions of the mirror part 12, mirror support parts 15 and 25 are formed. The actuators 14 and 24 have one end connected to the mirror support parts 15 and 25 and the other end fixed to fixing parts denoted by reference numerals 31 and 32, respectively.

The mirror part 12 in this example has a substantially rectangular shape in a planar view. On a mirror surface serving as a reflection surface 12B for reflecting light (an upper surface of the mirror part 12), a metal thin film made of Au (gold), Al (aluminum), or the like is formed to enhance reflectivity of incident light. A material and its film thickness for use in mirror coating are not particularly restrictive, and a known mirror material (a high-reflectivity material) can be used for various designs.

As for the shape of the mirror part 12, the "rectangular shape" is not restricted to a strict rectangle (quadrangle), but means a shape that can be grasped as a substantially rectangular shape as a basic shape as a whole. For example, the shape includes a rectangle with its corners chamfered or rounded, a rectangle with an entire or part of sides configured of a curve or a polygonal line, and a rectangle with an additional shape necessary for coupling being added to a connecting portion between the mirror part 12 and the actuators 14 and 24 (the mirror support parts denoted by 15 and 25). While the mirror part 12 with a square shape in a planar view is exemplarily depicted in FIG. 1 as the simplest example, the shape of the mirror part 12 is not restricted to the depicted example. Also, the shape of the mirror part 12 in a planar view and the shape of the reflection surface 12B may match each other or may be different from each other. The reflection surface 12B can be formed within an area region of the upper surface of the mirror part 12.

The mirror part 12 is coupled to the actuators 14 and 24 via the mirror support parts 15 and 25 at portions near a pair of diagonal vertexes (in FIG. 1, at a portion near a lower-left vertex and a portion near an upper-right vertex, respectively).

The actuators 14 and 24 for driving the mirror part 12 are coupled to the mirror part 12 via the mirror support parts 15 and 25 at portions near the pair of vertexes (in FIG. 1, at the portion near the lower-left vertex and the portion near the upper-right vertex, respectively). Note that the positions where the mirror support parts 15 and 25 are formed may be near diagonal positions of the mirror part 12 in a range in which target operations and effects can be achieved, and are not necessarily restricted to the "diagonal" vertex positions in a strict sense.

In FIG. 1, the actuator (reference numeral 14) placed in an L shape along a left side and an upper side of the mirror part 12 is referred to as a "first actuator", and the actuator (reference numeral 24) placed in an L shape along a right side and a lower side of the mirror part 12 is referred to as a "second actuator". Also, in FIG. 1, an x axis is taken in a horizontal direction (a lateral direction) on paper, and a y axis is taken in a vertical direction (a longitudinal direction on paper). Also, a z axis is taken in a direction perpendicular to paper (an xy plane). By introducing these orthogonal three axes (xyz axes), the device structure and its operation are described. The y axis corresponds to a "first axis" and the x axis corresponds to a "second axis".

The first actuator 14 is configured by connecting a plurality of piezoelectric cantilevers (in this example, four piezoelectric cantilevers 16-1, 16-2, 17-1, and 17-2) together as being folded. Of the plurality of piezoelectric cantilevers (16-1, 16-2, 17-1, and 17-2) configuring the first actuator 14, a plurality of (here, two) piezoelectric cantilevers 16-1 and 16-2 placed side by side with the longitudinal direction oriented to the y axis direction and at positions changed in the x direction (corresponding to "first piezoelectric cantilevers") are used in driving for rotating the mirror part 12 about the x axis.

A plurality of (here, two) piezoelectric cantilevers 17-1 and 17-2 placed side by side with the longitudinal direction oriented to the x axis direction and at positions changed in the y direction (corresponding to "second piezoelectric cantilevers") are used in driving for rotating the mirror part 12 about the y axis.

That is, the first actuator 14 is configured of the plurality of piezoelectric cantilevers 16-1 and 16-2 for rotating the mirror part 12 about the x axis and the plurality of piezoelectric cantilevers 17-1 and 17-2 for rotating the mirror part 12 about the y axis. The plurality of piezoelectric cantilevers 16-1 and 16-2 for x axis rotation each have its longitudinal direction oriented to the y axis direction, and the plurality of these piezoelectric cantilevers 16-1 and 16-2 are adjacently placed side by side in the x axis direction outside a first side (in FIG. 1, the left side) of the mirror part 12. The plurality of piezoelectric cantilevers 16-1 and 16-2 form an actuator element for x axis rotation (corresponding to an "actuator element for second axis rotation").

The plurality of piezoelectric cantilevers 17-1 and 17-2 for y axis rotation each have its longitudinal direction oriented to the x axis direction, and the plurality of these piezoelectric cantilevers 17-1 and 17-2 are adjacently placed side by side in the y axis direction outside a second side (in FIG. 1, the upper side) of the mirror part 12. The plurality of piezoelectric cantilevers 17-1 and 17-2 form an actuator element for y axis rotation (corresponding to "an actuator element for first axis rotation").

The plurality of piezoelectric cantilevers 17-1 and 17-2 for y axis rotation each have one end connected to each other (in FIG. 1, a left end connected to each other), and are coupled so as to be folded to the x direction (refer to FIG. 2). Ends of the piezoelectric cantilevers 17-1 and 17-2 opposite to a folded coupling part 18 of the piezoelectric cantilevers 17-1 and 17-2 are connected to ends of the piezoelectric cantilevers 16-1 and 16-2 for x axis rotation via coupling parts 19-1 and 19-2, respectively. The piezoelectric cantilevers 17-1 and 17-2 for y axis rotation and the piezoelectric cantilevers 16-1 and 16-2 for x axis rotation are respectively coupled to each other in an L shape (in the form of being folded at the right angle).

Of the plurality of piezoelectric cantilevers 16-1 and 16-2 for x axis rotation, the piezoelectric cantilever 16-2, which is near the mirror part 12, has one end (an end opposite to the coupling part 19-2 with the piezoelectric cantilever 17-2 for y axis rotation) coupled to the mirror part 12 via the mirror support part 15 near the lower-left corner of the mirror part 12 in FIG. 1.

Of the plurality of piezoelectric cantilevers 16-1 and 16-2 for x axis rotation, the piezoelectric cantilever 16-1, which is away from the mirror part 12, has a base end (an end opposite to the coupling part 19-1 with the piezoelectric cantilever 17-1 for y axis rotation) fixed to a first fixing part 31 of the fixing frame 30 near the lower-left corner of the mirror part 12, that is, near the mirror support part 15 in FIG. 1.

When viewed from the first fixing part 31, the base end of the piezoelectric cantilever 16-1 is supported on the first fixing part 31, and the piezoelectric cantilever 17-1 is connected, with its longitudinal direction oriented to the x axis direction, to a tip of the piezoelectric cantilever 16-1 with its longitudinal direction oriented to the y axis direction. To the tip of this piezoelectric cantilever 17-1, the piezoelectric cantilever 17-2 is coupled so as to be folded to the x axis direction. Furthermore, to the tip of the piezoelectric cantilever 17-2, the piezoelectric cantilever 16-2 is connected so as to be folded to the y axis direction. Eventually, the tip of the piezoelectric cantilever 16-2 is coupled to the mirror part 12 near a corner of the mirror part 12 (in FIG. 1, near the lower-left corner of the mirror part 12), and the mirror part 12 is supported by the mirror support part 15.

As such, the plurality of piezoelectric cantilevers 16-1, 17-1, 17-2, and 16-2 are sequentially connected so as to have a folded structure, thereby achieving a structure in which the first fixing part 31 of the first actuator 14 and the mirror support part 15 are very close to each other.

To cancel influences of initial warpage due to residual stress of the piezoelectric cantilevers, offset driving, and others, the distance between the first fixing part 31 and the mirror support part 15 is preferably as short as possible. However, due to structural restrictions of the first actuator 14, their positions cannot be the same. In the case of FIG. 1, the first fixing part 31 and the mirror support part 15 are away from each other approximately a width dimension (w) of the piezoelectric cantilever 16-2 in a short direction (refer to FIG. 3). Also, as the first fixing part 31, it can be thought that a left side portion of the lower end of the piezoelectric cantilever 16-1 is fixed in place of a lower end face of the piezoelectric cantilever 16-1 in FIG. 3. In this case, the first fixing part 31 and the mirror support part 15 are away from each other approximately a width direction ($w_A$) in the x axis direction of the actuator element for x axis rotation formed of two piezoelectric cantilevers 16-1 and 16-2.

In view of these, an allowable degree of proximity between the first fixing part 31 and the mirror support part 15 is within a range of the width dimension ($w_A$) in the x axis direction of the actuator element for x axis rotation formed of the plurality of piezoelectric cantilevers 16-1 and 16-2.

The second actuator 24 has a structure similar to that of the first actuator 14, and the second actuator 24 and the first actuator 14 are placed so as to have a diagonal positional relation across the mirror part 12. That is, the second actuator 24 is configured of a plurality of piezoelectric cantilevers (in this example, four piezoelectric cantilevers 26-1, 26-2, 27-1, and 27-2) connected together. The second actuator 24 is configured of the plurality of piezoelectric cantilevers 26-1 and 26-2 (corresponding to "the first piezoelectric cantilever") for rotating the mirror part 12 about the x axis and the plurality of piezoelectric cantilevers 27-1 and 27-2 (corresponding to "the second piezoelectric cantilever") for rotating the mirror part 12 about the y axis. The plurality of piezoelectric cantilevers 26-1 and 26-2 for x axis rotation each have its longitudinal direction oriented to the y axis direction, and the plurality of these piezoelectric cantilevers 26-1 and 26-2 are adjacently placed side by side in the x axis direction outside a third side (in FIG. 1, the right side) of the mirror part 12. The plurality of piezoelectric cantilevers 26-1 and 26-2 form an actuator element for x axis rotation (corresponding to an "actuator element for second axis rotation").

The plurality of piezoelectric cantilevers 27-1 and 27-2 for y axis rotation each have its longitudinal direction oriented to the x axis direction, and the plurality of these piezoelectric cantilevers 27-1 and 27-2 are adjacently placed side by side in the y axis direction outside a fourth side (in FIG. 1, the lower side) of the mirror part 12. The plurality of piezoelectric cantilevers 27-1 and 27-2 form an actuator elements for y axis rotation (corresponding to an "actuator element for first axis rotation").

The plurality of piezoelectric cantilevers 27-1 and 27-2 for y axis rotation each have one end connected to each other, and are coupled so as to be folded to the x direction. Ends of the piezoelectric cantilevers 27-1 and 27-2 opposite to a folded coupling part 28 of the piezoelectric cantilevers 27-1 and 27-2 are connected to ends of the piezoelectric cantilevers 26-1 and 26-2 for x axis rotation via coupling parts 29-1 and 29-2, respectively. The piezoelectric cantilevers 27-1 and 27-2 for y axis rotation and the piezoelectric cantilevers 26-1 and 26-2 for x axis rotation are respectively coupled to each other in an L shape (in the form of being folded at the right angle).

Of the plurality of piezoelectric cantilevers 26-1 and 26-2 for x axis rotation, the piezoelectric cantilever 26-2, which is near the mirror part 12, has one end (an end opposite to the coupling part 29-2 with the piezoelectric cantilever 27-2 for y axis rotation) coupled to the mirror part 12 via the mirror support part 25 near the upper-right corner of the mirror part 12 in FIG. 1.

Of the plurality of piezoelectric cantilevers 26-1 and 26-2 for x axis rotation, the piezoelectric cantilever 26-1, which is away from the mirror part 12, has a base end (an end opposite to the coupling part 29-1 with the piezoelectric cantilever 27-1 for y axis rotation) fixed to a second fixing part 32 of the fixing frame 30 near the upper-right corner of the mirror part 12, that is, near the mirror support part 25 in FIG. 1.

When viewed from the second fixing part 32, the base end of the piezoelectric cantilever 26-1 is supported on the second fixing part 32, and the piezoelectric cantilever 27-1 is connected, with its longitudinal direction oriented to the x axis direction, to a tip of the piezoelectric cantilever 26-1 with its longitudinal direction oriented to the y axis direction. To the tip of this piezoelectric cantilever 27-1, the piezoelectric cantilever 27-2 is coupled so as to be folded to the x axis direction. Furthermore, to the tip of the piezoelectric cantilever 27-2, the piezoelectric cantilever 26-2 is connected so as to be folded to the y axis direction. Eventually, the tip of the piezoelectric cantilever 26-2 is coupled via the mirror support part 25 to the mirror part 12 near a corner of the mirror part 12 (in FIG. 1, near the upper-right corner of the mirror part 12). As such, the plurality of piezoelectric cantilevers 26-1, 27-1, 27-2, and 26-2 are sequentially connected so as to have a folded structure, thereby achieving a structure in which the second fixing part 32 of the second actuator 24 and the mirror support part 25 are very close to each other. As for the degree of proximity between the second fixing part 32 and the mirror support part 25, the positional relation is similar to that between the first fixing part 31 and the mirror support part 15.

In FIG. 1, reference numerals 41, 42, 43, and 44 are drive pads (drive power supply terminals) for supplying drive voltage to the piezoelectric cantilevers 16-1, 16-2, 17-1, and 17-2 configuring the first actuator 14. Although not illustrated in FIG. 1, the drive pads 41, 42, 43, and 44 are connected via fine wires 51, 52, 53, and 54 to upper electrodes of the corresponding piezoelectric cantilevers 16-1, 16-2, 17-1, and 17-2, respectively.

Also, reference numerals 61, 62, 63, and 64 are drive pads for supplying drive voltage to the piezoelectric cantilevers 26-1, 26-2, 27-1, and 27-2 configuring the second actuator 24. Although not illustrated in FIG. 1, the drive pads 61, 62, 63, and 64 are connected via fine wires 71, 72, 73, and 74 to upper electrodes of the corresponding piezoelectric cantilevers 26-1, 26-2, 27-1, and 27-2, respectively.

For reference, an enlarged view of a potion near the coupling part 18 of the piezoelectric cantilevers 17-1 and 17-2 in FIG. 1 is depicted in FIG. 2. A wire 53 drawn from the upper electrode of the piezoelectric cantilever 17-2 is routed from the coupling part 18 along the edge of the piezoelectric cantilever 17-1, and then via the coupling part 19-1 and the piezoelectric cantilever 16-1 in FIG. 1 to be connected to the drive pad 43. A wire 54 drawn from the upper electrode of the piezoelectric cantilever 16-2 is routed from the coupling part 19-2 in FIG. 1 along the edge of the piezoelectric cantilever 17-2, and then via the coupling part 18, the coupling part 17-1, the coupling part 19-1, and the piezoelectric cantilever 16-1 to be connected to the drive pad 44.

As such, the upper electrode of each piezoelectric cantilever is individually (independently) connected to a corresponding one of the drive pads (41 to 44 and 61 to 64), thereby allowing independent driving control over each piezoelectric cantilever. Note that the lower electrode of each cantilever can be formed as a common (integrally connected) electrode for the plurality of cantilevers.

Figure 4:
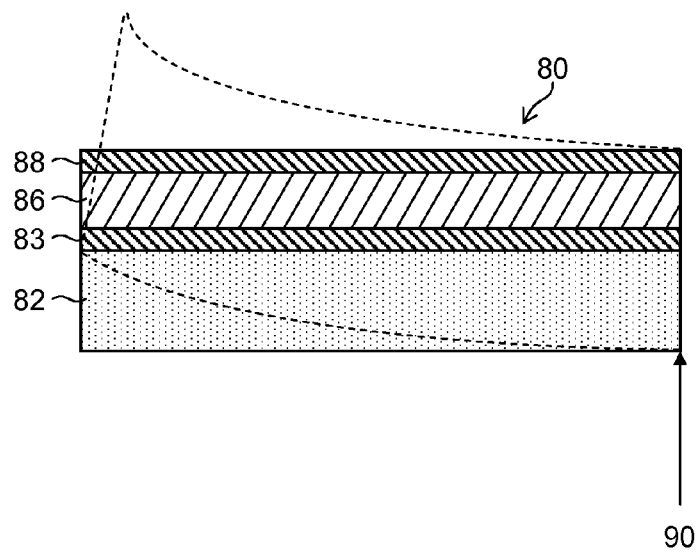
FIG. 4 is a sectional view of a piezoelectric cantilever.

FIG. 4 is a schematic view of a section structure of the piezoelectric cantilever. Since the piezoelectric cantilevers 16-1, 16-2, 17-1, 17-2, 26-1, 26-2, 27-1, and 27-2 each have a similar structure, the structure of a piezoelectric cantilever as a representative and provided with a reference numeral 80 is described. The piezoelectric cantilever 80 of the present example is formed of a piezoelectric unimorph cantilever structure. Note that for implementation of the presently disclosed subject matter, a structure other than the unimorph cantilever structure may be used. For example, a bimorph cantilever structure may be used, in which two layers of piezoelectric substance are laminated across electrodes.

As depicted in FIG. 4, the piezoelectric cantilever 80 has a structure in which a lower electrode 83, a piezoelectric substance 86, and an upper electrode 88 are formed to be laminated on a diaphragm 82. This laminated structure can be obtained by, for example, sequentially forming layers of the lower electrode 83, the piezoelectric substance 86, and the upper electrode 88 on a silicon (Si) substrate. A right end (reference numeral 90) in FIG. 4 serves as a support part (a fixing part) as a fixing end of the piezoelectric cantilever 80. In the structure depicted in FIG. 4, a drive voltage applied between the electrodes (83 and 88) deforms the piezoelectric substance 86. In accordance with this deformation, the diaphragm 82 is warped to move the lever part upward and downward. A broken line in FIG. 4 represents the state in which the lever part is displaced upward.

Note that a fixing part 90 for the piezoelectric cantilever 16-1 depicted in FIG. 1 corresponds to the first fixing part 31 described in FIG. 1. A fixing part 90 for the piezoelectric cantilever 17-1 corresponds to the coupling part 19-1, and a fixing part 90 for the piezoelectric cantilever 17-2 corresponds to the coupling part 18 described in FIG. 1. A fixing part 90 for the piezoelectric cantilever 16-2 corresponds to the coupling part 19-2 described in FIG. 2. A fixing part 90 for the piezoelectric cantilever 26-1 corresponds to the second fixing part 32 described in FIG. 1. A fixing part 90 for the piezoelectric cantilever 27-1 depicted in FIG. 1 corresponds to the coupling part 29-1, and a fixing part 90 for the piezoelectric cantilever 27-2 corresponds to the coupling part 28 described in FIG. 1. A fixing part 90 for the piezoelectric cantilever 26-2 corresponds to the coupling part 29-2 described in FIG. 1.

<Description of Rotation Operation of Mirror Part>

(1) Regarding Mirror Rotation about the x Axis

First, rotation about the x axis is described. A drive voltage is applied to the piezoelectric cantilevers 16-1 and 16-2 of the first actuator 14 depicted in FIG. 5 so as to cause bending displacements in opposite directions. A drive voltage is also applied to the piezoelectric cantilevers 26-1 and 26-2 of the second actuator 24 so as to cause bending displacements in opposite directions. Furthermore, the piezoelectric cantilever 16-1 of the first actuator 14 and the piezoelectric cantilever 26-1 of the second actuator 24 are driven so as to cause bending displacements in the opposite directions, and the piezoelectric cantilever 16-2 of the first actuator 14 and the piezoelectric cantilever 26-2 of the second actuator 24 are driven so as to cause bending displacements in the opposite directions. That is, the first actuator 14 and the second actuator 24 are displaced in opposite directions to displace opposite angles of the mirror part 12 in opposite directions, thereby tilting the mirror part 12.

Figure 5:
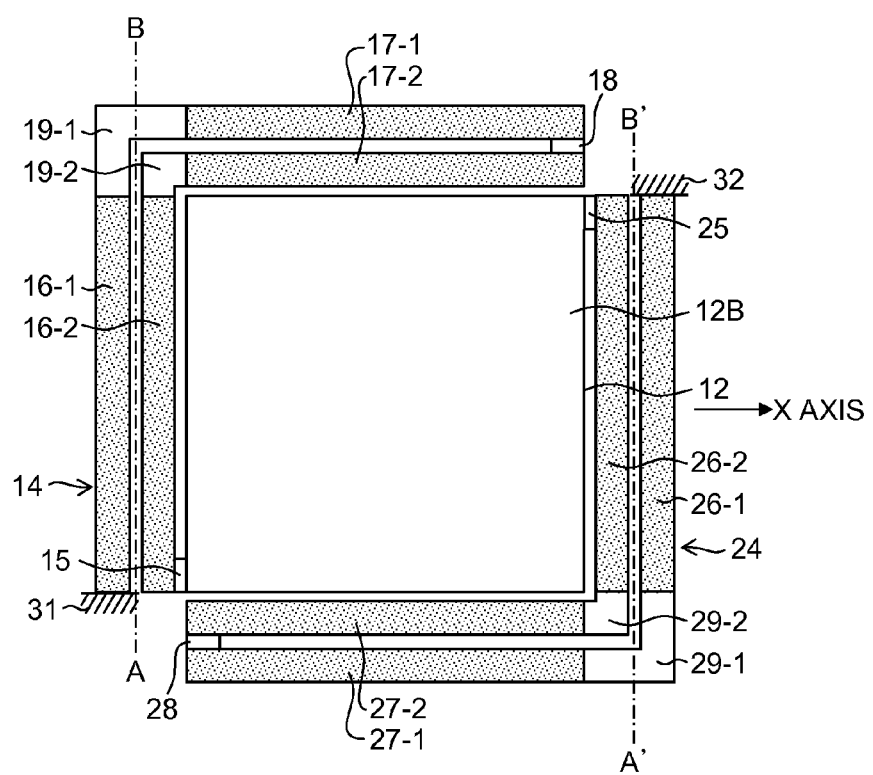
FIG. 5 is a schematic view for use in describing mirror rotation about an x axis.
Figure 6:
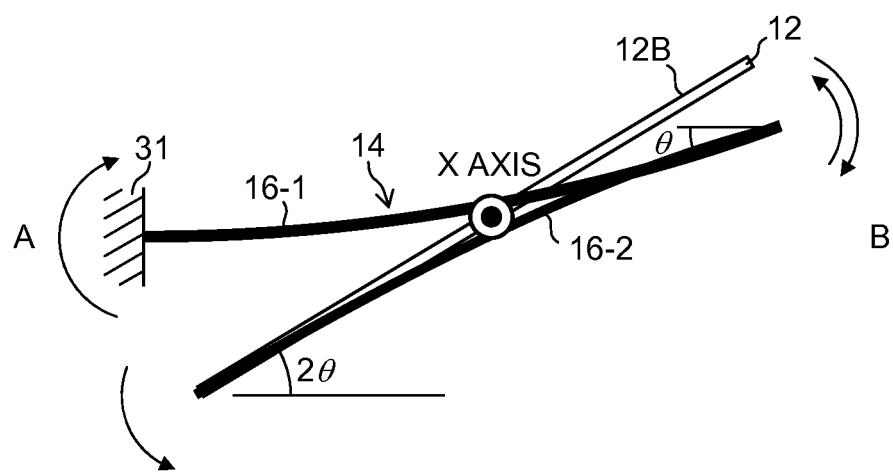
FIG. 6 is a schematic view of a section along an A-B line in FIG. 5 when viewed from a positive direction of the x axis.
Figure 7:
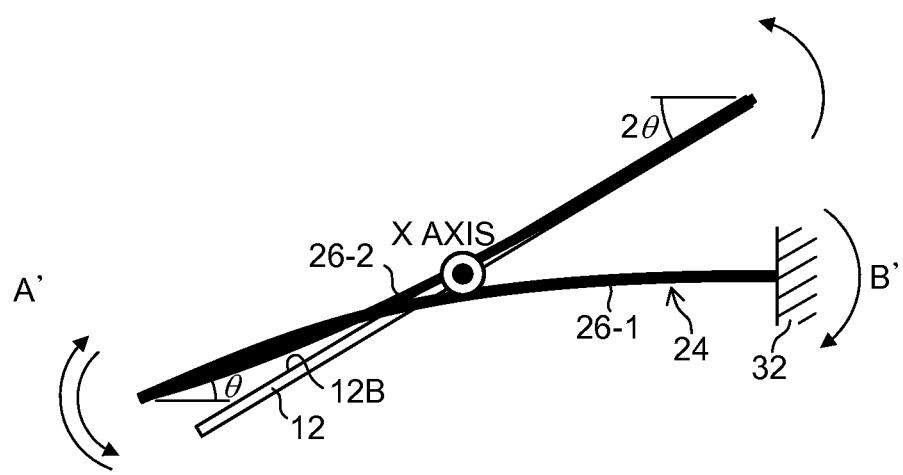
FIG. 7 is a schematic view of a section along an A'-B' line in FIG. 5 when viewed from the positive direction of the x axis.

A schematic view of a section along an A-B line in FIG. 5 when viewed from a positive direction of the x axis is depicted in FIG. 6, and a schematic view of a section along an A'-B' line in FIG. 5 when viewed from the positive direction of the x axis is depicted in FIG. 7.

As depicted in FIG. 6, with a drive voltage being applied to the adjacent piezoelectric cantilevers 16-1 and 16-2 so as to cause bending displacements in opposite directions, an angular displacement A at the tip of each of the piezoelectric cantilevers 16-1 and 16-2 is added and transmitted to the mirror support part 15. Similarly, as depicted in FIG. 7, with a drive voltage being applied to the adjacent piezoelectric cantilevers 26-1 and 26-2 so as to cause bending displacements in opposite directions, an angular displacement A at the tip of each of the piezoelectric cantilevers 26-1 and 26-2 is added and transmitted to the mirror support part 25.

Figure 8:
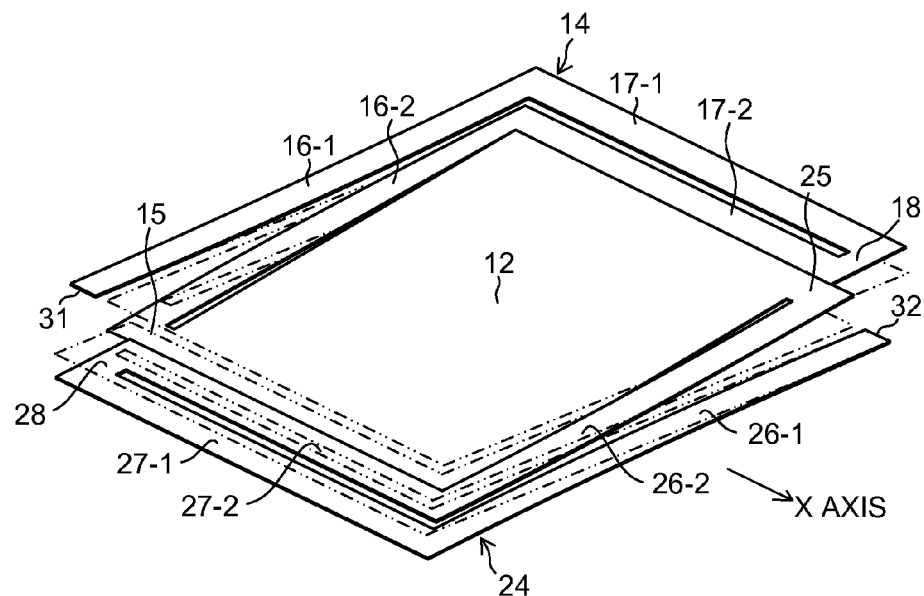
FIG. 8 is a perspective view of the state of mirror rotation about the x axis.

Also, as depicted in FIG. 6 and FIG. 7, the first actuator 14 and the second actuator 24 are driven so as to transmit angular displacements in opposite directions to the mirror support parts 15 and 25, respectively. As a result, the mirror unit 12 becomes tilted about the x axis at an angle of 2θ. For reference, FIG. 8 is a perspective view of the state in which the mirror unit 12 is rotated and tilted about the x axis.

(2) Regarding Mirror Rotation about the y Axis

Next, rotation about the y axis is described. A drive voltage is applied to the piezoelectric cantilevers 17-1 and 17-2 of the first actuator 14 depicted in FIG. 9 so as to cause bending displacements in opposite directions. A drive voltage is also applied to the piezoelectric cantilevers 27-1 and 27-2 of the second actuator 24 so as to cause bending displacements in opposite directions. Furthermore, the piezoelectric cantilever 17-1 of the first actuator 14 and the piezoelectric cantilever 27-1 of the second actuator 24 are driven so as to cause bending displacements in the opposite directions, and the piezoelectric cantilever 17-2 of the first actuator 14 and the piezoelectric cantilever 27-2 of the second actuator 24 are driven so as to cause bending displacements in the opposite directions. That is, the first actuator 14 and the second actuator 24 are displaced in opposite directions to displace opposite angles of the mirror part 12 in opposite directions, thereby tilting the mirror.

Figure 9:
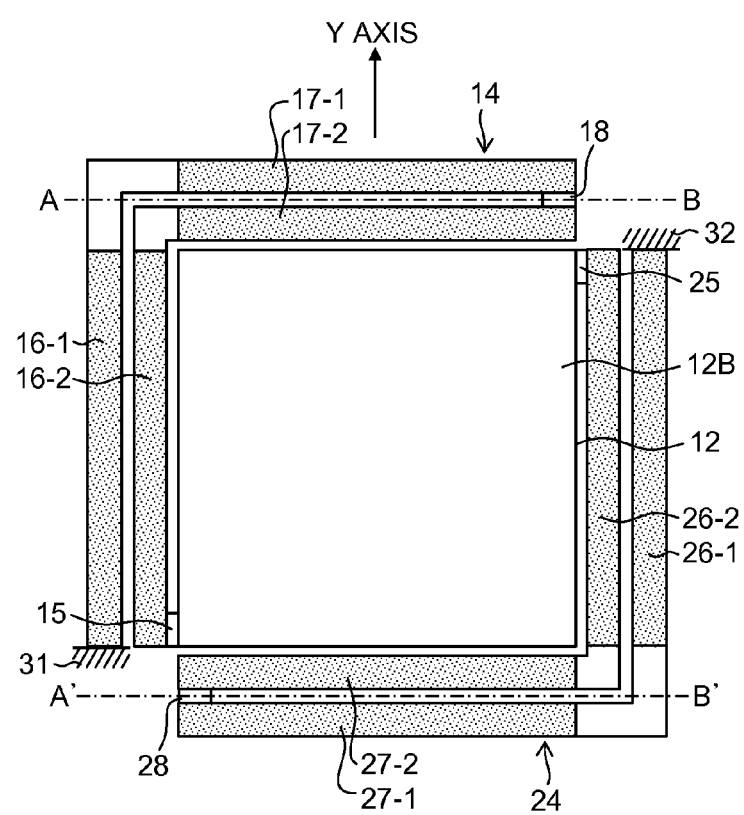
FIG. 9 is a schematic view for use in describing mirror rotation about a y axis.
Figure 10:
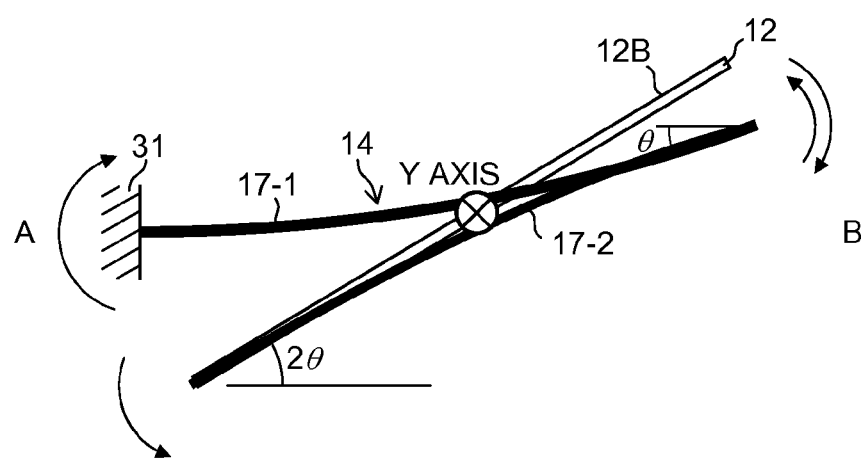
FIG. 10 is a schematic view of a section along an A-B line in FIG. 9 when viewed from a negative direction of the y axis.
Figure 11:
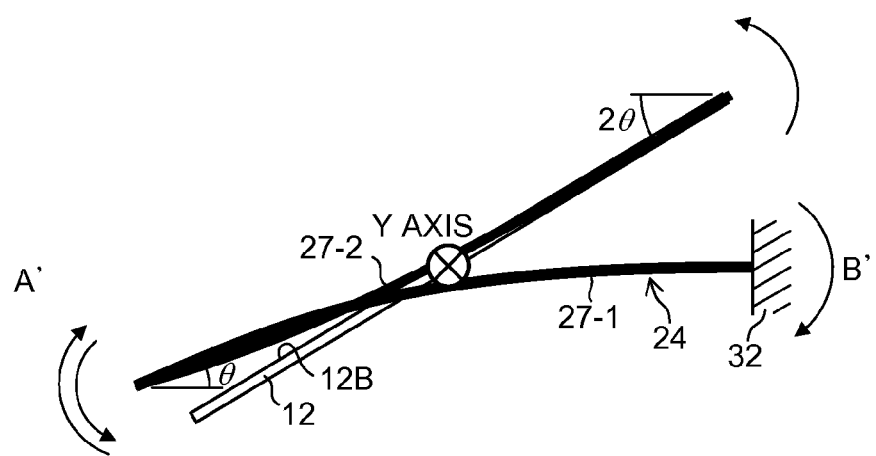
FIG. 11 is a schematic view of a section along an A'-B' line in FIG. 9 when viewed from the negative direction of the y axis.

A schematic view of a section along an A-B line in FIG. 9 when viewed from a negative direction of the y axis is depicted in FIG. 10, and a schematic view of a section along an A'-B' line in FIG. 9 when viewed from the negative direction of the y axis is depicted in FIG. 11.

As depicted in FIG. 10, with a drive voltage being applied to the adjacent piezoelectric cantilevers 17-1 and 17-2 so as to cause bending displacements in opposite directions, an angular displacement θ at the tip of each of the piezoelectric cantilevers 17-1 and 17-2 is added and transmitted to the mirror support part 15. Similarly, as depicted in FIG. 11, with a drive voltage being applied to the adjacent piezoelectric cantilevers 27-1 and 27-2 so as to cause bending displacements in opposite directions, an angular displacement θ at the tip of each of the piezoelectric cantilevers 27-1 and 27-2 is added and transmitted to the mirror support part 25.

Also, as depicted in FIG. 10 and FIG. 11, the first actuator 14 and the second actuator 24 are driven so as to transmit angular displacements in opposite directions to the mirror support parts 15 and 25, respectively. As a result, the mirror unit 12 becomes tilted about the y axis at an angle of 2θ. For reference, FIG. 12 is a perspective view of the state in which the mirror unit 12 is rotated and tilted about the y axis.

Figure 12:
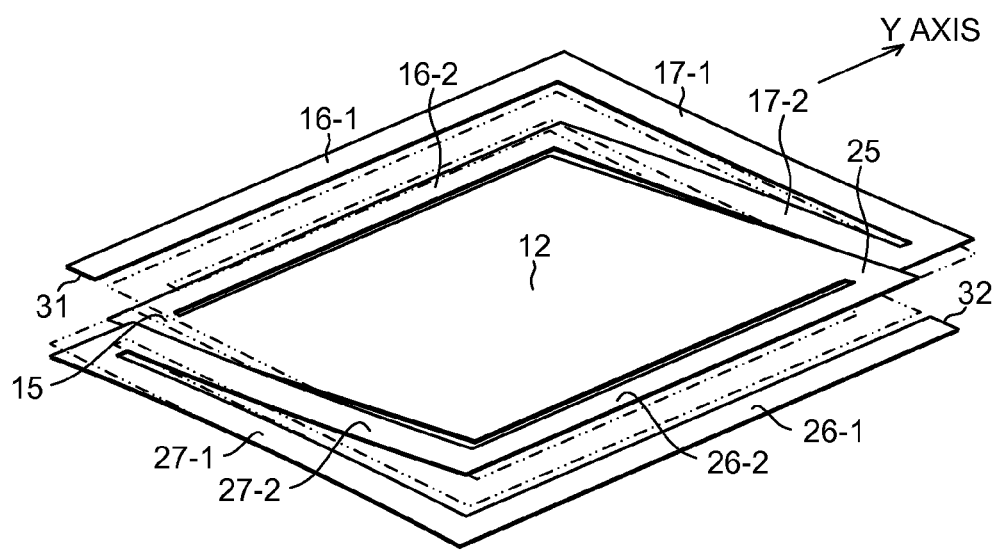
FIG. 12 is a perspective view of the state of mirror rotation about the y axis.

By combining rotation driving about the x axis described in FIG. 6 to FIG. 9 and rotation driving about the y axis described in FIG. 10 to FIG. 12, the mirror part 12 can be tilted in various directions, allowing two-dimensional scanning. Light incident to the mirror part 12 (for example, laser light emitted from a laser light source not illustrated) is reflected according to the gradient (angle) of the mirror part 12, thereby changing the traveling direction of reflected light (irradiation position of reflected light). According to the MEMS scanner device 10 of the present embodiment, optical scanning can be performed with a large light deflection angle.

<Regarding Drive Voltage Supply Means>

Figure 13:
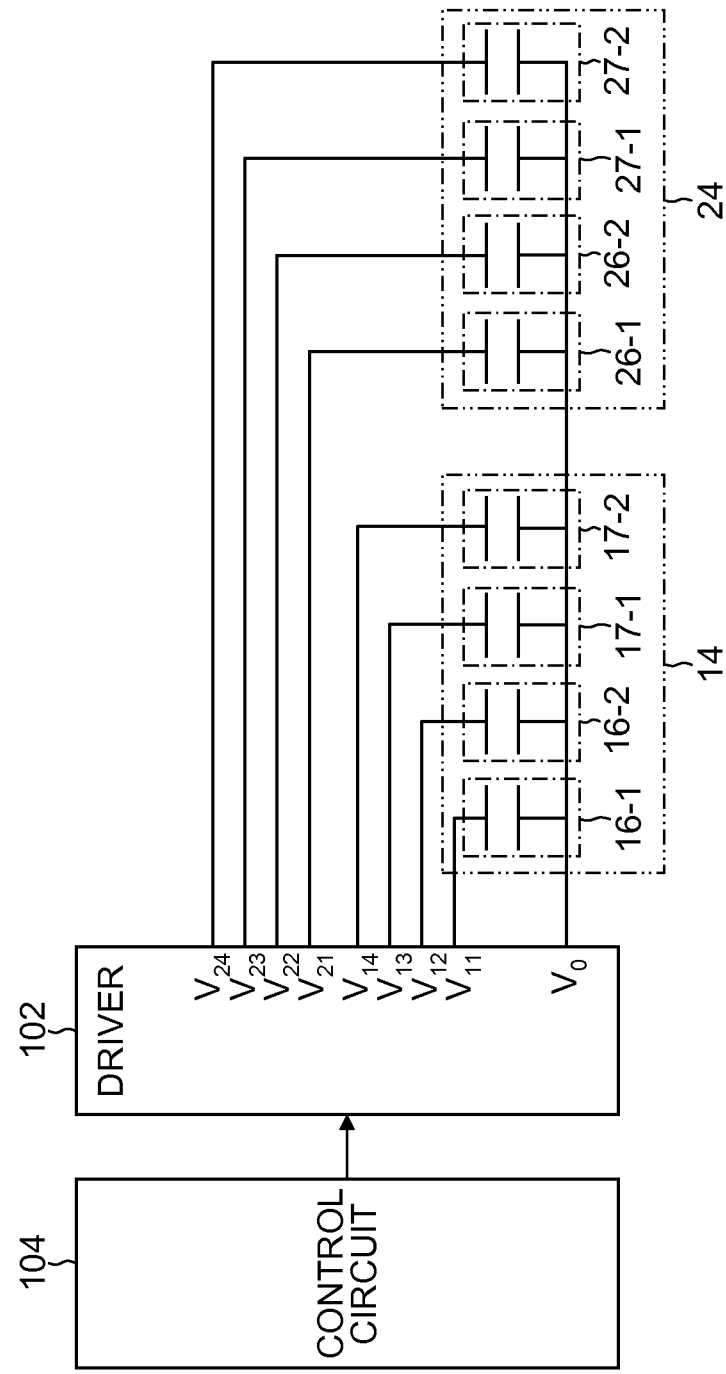
FIG. 13 is a drawing for describing an example of structure of a drive circuit supplying a drive voltage to actuators for driving a mirror part.

FIG. 13 is a drawing for describing an example of structure of a drive circuit supplying a drive voltage to the first actuator 14 and the second actuator 24. The piezoelectric cantilevers 16-1, 16-2, 17-1, and 17-2 included in the first actuator 14 each have an upper electrode connected to a corresponding terminal of a driver circuit 102. Also, the piezoelectric cantilevers 26-1, 26-2, 27-1, and 27-2 included in the second actuator 24 each have an upper electrode connected to a corresponding terminal of a driver circuit 102. Furthermore, each piezoelectric cantilever has a lower electrode connected to a common terminal (a $V_0$ terminal, for example, a GND terminal) of the driver circuit 102.

According to a potential difference between voltages $V_{11}$ to $V_{24}$ to be applied to the upper electrodes of the piezoelectric cantilevers and the lower electrodes, the piezoelectric substance 86 of each piezoelectric cantilever is piezoelectrically deformed to cause a bending displacement. As described above, the structure in which a drive voltage can be individually (independently) supplied to each piezoelectric cantilever may be adopted, or terminals of the plurality of cantilevers to which the same drive voltage is supplied in the same phase at the time of driving may be regarded as one.

The control circuit 104 sends a control signal to the driver circuit 102, controlling application of a drive voltage to each of the piezoelectric cantilevers (16-1, 16-2, 17-1, 17-2, 26-1, 26-2, 27-1, and 27-2).

The driving waveform to be supplied to each piezoelectric cantilever is not particularly restrictive. For example, a drive voltage of a sine wave may be supplied, or a pulse waveform signal can be used. The driver circuit depicted in FIG. 13 or the combination of the driver circuit 102 and the control circuit 104 corresponds to a "drive voltage supply circuit".

<Regarding Piezoelectric Material>

An example of the piezoelectric substance suitable for the present embodiment contains one type or two or more of perovskite-type oxide (P) represented by the following formula:

A general formula $ABO_3$        (P)

(where A: at least one type of A site element containing Pb;
B: at least one type of B site element selected from the group comprising Ti, Zr, V, Nb, Ta, Sb, Cr, Mo, W, Mn, Sc, Co, Cu, In, Sn, Ga, Zn, Cd, Fe, and Ni;
O: oxygen element; and
while the A site element, the B site element, and the oxygen element are in a molar ratio of 1:1:3 as a standard molar ratio, a tolerance can exist between a molar ratio of the A site element, the B site element, and the oxygen element and the standard molar ratio as long as a perovskite structure can be taken).

Examples of the perovskite-type oxide represented by the above general formula include lead-containing compounds, such as lead titanate, lead zirconate titanate (PZT), lead zirconate, lead lanthanum titanate, lead lanthanum zirconate titanate, magnesium niobate lead zirconium titanate, nickel niobate lead zirconium titanate, and zinc niobate lead zirconium titanate, and mixed crystals thereof; and lead-free compounds, such as barium titanate, barium strontium titanate, sodium bismuth titanate, potassium bismuth titanate, sodium niobate, potassium niobate, lithium niobate, and bismuth ferrite, and mixed crystals thereof.

Also, the piezoelectric film of the present embodiment preferably contains one type or two or more of perovskite-type oxide (PX) represented by the following formula:

$A_a(Zr_x, Ti_y, Mb_{x-y})_bO_c$        (PX)

(where A: at least one type of A site element containing Pb;
M: at least one type of element selected from the group comprising V, Nb, Ta, and Sb;
$0<x<b$, $0<y<b$, $0<b-x-y$; and
while a, b, and c are in a molar ratio of 1:1:3 as a standard molar ratio, a tolerance can exist between a molar ratio: a:b:c and the standard molar ratio as long as a perovskite structure can be taken).

Since the piezoelectric film made of the perovskite-type oxide represented by the general formula (P) or the formula (PX) has a high piezoelectric strain constant (d31 constant), the piezoelectric actuator including this piezoelectric film is excellent in displacement characteristics. Note that the perovskite-type oxide represented by the general formula (PX) has a piezoelectric constant higher than that of the perovskite-type oxide represented by the formula (P).

Also, the piezoelectric actuator including any of the piezoelectric films made of the perovskite-type oxides represented by the general formula (P) and the formula (PX) has voltage-displacement characteristics with excellent linearity in a drive voltage range. These piezoelectric materials exhibit excellent piezoelectric characteristics in implementing the presently disclosed subject matter.

As a specific example of the piezoelectric substance 86 in the present embodiment, a PZT thin film doped with 12% Nb can be used. By forming a PZT film doped with 12% Nb by sputtering, a thin film with excellent piezoelectric characteristics of a piezoelectric constant d31=250 pmN can be stably fabricated.

Note that while a bulk of the piezoelectric substance may be jointed to a substrate for polishing, it is difficult to make the piezoelectric substance thinner with this method (in polishing, the limit is on the order of 15 μm), posing problems such that the amount of displacement is small and yield is small in the case of destruction during polishing or the like. In view of these, a preferable structure is such that a piezoelectric thin film is directly formed on a substrate by chemical vapor deposition, a sol-gel process, or the like. In particular, as the piezoelectric substance 86 of the present embodiment, a thin film having a thickness of 1 μm or thicker and 10 μm or thinner is preferable. In an example described further below, a PZT thin film having a thickness of 4 μm and formed by sputtering is used as the piezoelectric substance 86, but this is not restrictive.

Figure 14:
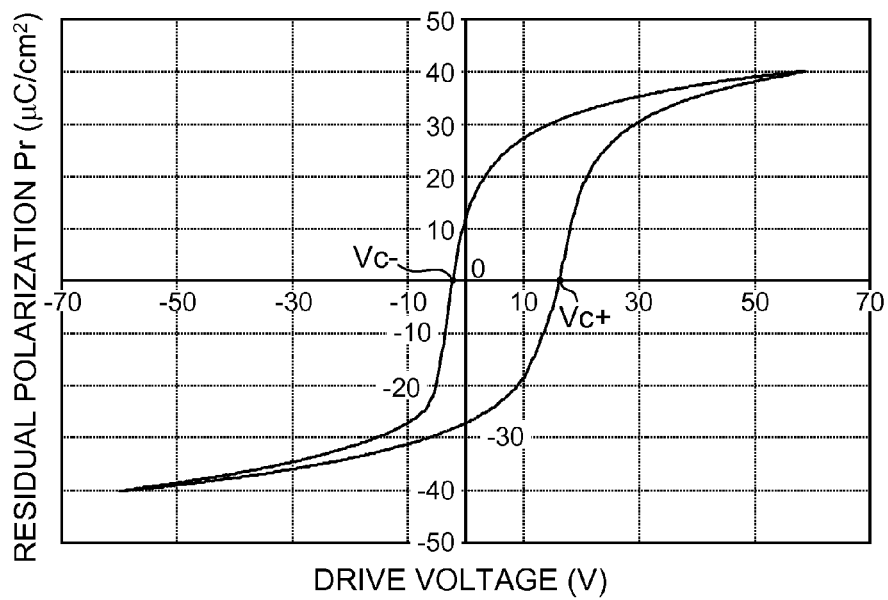
FIG. 14 is a drawing of Pr-E hysteresis characteristics of a piezoelectric film for use in the embodiment.

FIG. 14 is a drawing of Pr-E hysteresis characteristics of a piezoelectric film (a film thickness of 4 μm) for use in the present embodiment. Here, a modified PZT film doped with Nb was used. Note that while the horizontal axis in FIG. 14 represents "drive voltage (unit: volt [V]), the voltage divided by the film thickness equals an electric field. A coercive field is at a point where the residual polarization becomes zero in the graph of Pr-E hysteresis characteristics, and the coercive field of the piezoelectric film in the present example is approximately 35 kV/cm on a positive field side (Ec+) and approximately 7.5 kV/cm on a negative field side (Ec−). In FIG. 14, Vc+ represents a voltage corresponding to the coercive field (Ec+) on the positive field side (the product of the coercive field Ec+ and the film thickness), and Vc− represents a voltage corresponding to the coercive field (Ec−) on the negative field side (the product of the coercive field Ec− and the film thickness).

A PZTN film for use in the present embodiment is formed by vapor growth such as sputtering, and Pr-E hysteresis of this film is biased to the positive field side, that is, asymmetric with respect to the y axis as depicted in FIG. 14. The absolute value of the coercive field Ec− on the negative field side and the absolute value of the coercive field Ec+ on the positive field side are different from each other, and a relation of |Ec+|>|Ec−| holds. As such, in the piezoelectric film with asymmetric Pr-E hysteresis biased to the positive field side, when a positive field is applied, polarization is difficult because the coercive field Ec+ is large. When a negative field is applied, polarization easily occurs because the absolute value of the coercive field Ec− is small.

That is, with the driving by application of an electric field with a polarity on a side where the absolute value of the coercive field value is small (in this case, with minus driving), excellent piezoelectric performance can be obtained.

Note that while a piezoelectric substance having Pr-E hysteresis characteristics biased to the positive field side is taken as an example in the present embodiment, a piezoelectric substance having Pr-E hysteresis characteristics biased to the negative field side merely has a different sign and can also achieve similar operations and effects.

Figure 15:
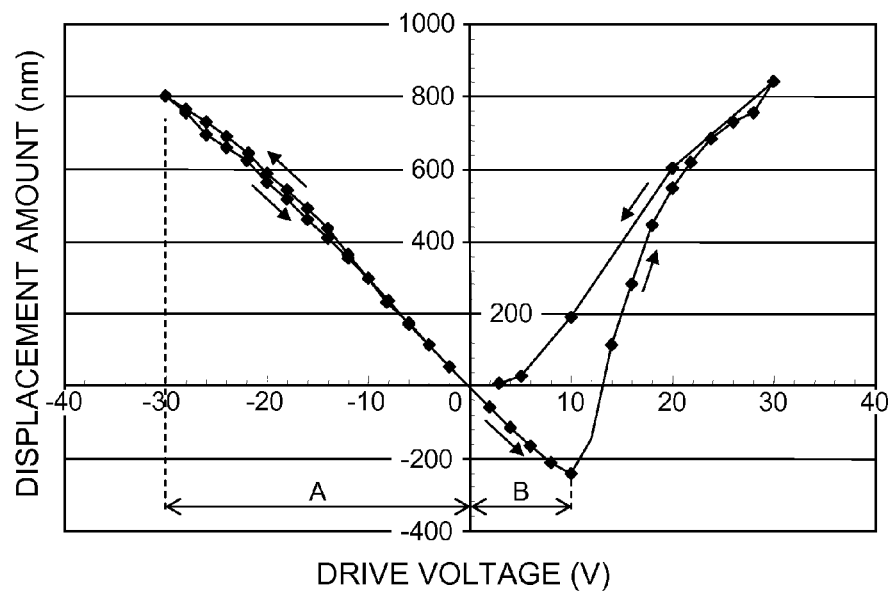
FIG. 15 is a drawing that depicts a relation between drive voltage and displacement of a piezoelectric actuator including a piezoelectric film having the characteristics of FIG. 14.

FIG. 15 is a drawing that depicts a relation between drive voltage and displacement when a piezoelectric actuator including a piezoelectric film having the Pr-E hysteresis characteristics of FIG. 14 is driven. In FIG. 15, a diaphragm-type piezoelectric actuator is fabricated to examine "electric field-displacement hysteresis characteristics". Here, positive and negative signs of the drive voltage are defined with a lower electrode being taken as a reference potential (ground). Note that in the polarization state of the piezoelectric film in the piezoelectric actuator at the time of non-driving, an upper electrode side assumes +, and a lower electrode side assumes − (a polarization vector is oriented upward). Also, regarding the amount of displacement, the amount of displacement of a diaphragm in a direction projecting downward is defined as a displacement in a "+direction", and the amount of displacement of the diaphragm in a direction projecting upward is defined as a displacement in a "−direction".

When attention is paid to the case in which the minus voltage is applied as a drive voltage, as the absolute value of the minus voltage is increased from 0 V (on a negative field side on left in FIG. 14), the amount of displacement is increased with a substantially linear relation proportional relation) in response to the increase in the absolute value of applied voltage. Here, the amount of displacement in a direction in which the diaphragm projects downward is taken as an amount of displacement in the "+direction". Conversely, as the absolute value of the minus voltage to be applied is gradually decreased, the amount of displacement is decreased with a proportional relation similar to the above in response to the decrease in the absolute value of applied voltage. As illustrated, there is little history on the negative field side, and high linearity is achieved (a region indicated by a reference character A in FIG. 15). Note that an error in linearity due to history is 1% or lower in FIG. 15.

Furthermore, even when the voltage is changed from the minus voltage to exceed 0 V to be shifted to the plus voltage, there is a linear region for a while (a region indicated by a reference character B in FIG. 15). That is, in a range in which the drive voltage is 0 to approximately 10 V on the positive field side, an amount of displacement in an opposite direction is obtained in substantially proportion to the strength of the applied voltage (electric field). As such, there is a linear region displaced in an opposite direction (in a direction projecting upward) when a plus voltage is applied.

A linear region (a section of the regions A+B) is formed, in which the linear region on the negative field side described above (the reference character A in FIG. 15) and this linear region on the positive field side (the reference character B in FIG. 15) are contiguous and a substantially linear relation is achieved in a contiguous range across a negative voltage side and a positive voltage side. As such, there is a linear region on the positive field side (the region indicated by the reference character B) contiguous from the linear region on the negative field side (reference character A). For stable use of the actuator using the piezoelectric thin film having these characteristics, the drive voltage to be applied to the upper electrode is preferably the coercive field on the +side or lower. Also, when a voltage exceeding the coercive filed is applied, the polarization is reversed in an opposite direction. To prevent this, it is preferable, for example, to apply an offset DC voltage in a minus direction and apply a plus/minus voltage in a range of the coercive field or lower with reference to this offset DC voltage.

EXAMPLE 1

Example of Method of Manufacturing MEMS Scanner Device

As Example 1, the MEMS scanner device 10 was fabricated through the following procedure.

(Process 1)

On a SOI (Silicon On Insulator) substrate having a handle layer of 350 μm, a box layer of 1 μm, and a device layer of 10 μm, a Ti layer of 30 nm and an Ir electrode layer of 150 nm were formed by sputtering at a substrate temperature of 350 degrees Celsius. These Ti layer and Ir electrode layer correspond to the lower electrode 83 in FIG. 4.

(Process 2)

On the obtained substrate described above, a film of a PZT layer of 2 μm was formed by using a radio frequency (RF) sputtering device. As a film forming gas, a mixed gas of 97.5% Ar and 2.5% $O_2$ was used, and a target material with a composition of Pb 1.3 ((Zr 0.52 Ti 0.48) 0.88 Nb 0.12) O3 was used. The film forming pressure was 2.2 m Torr, and the film formation temperature was 450 degrees Celsius.

(Process 3)

The substrate obtained above was processed based on a silicone processing process to fabricate a MEMS scanner device structured as in FIG. 1 to FIG. 3. An upper electrode was obtained by patterning the Pt/Ti layer by a lift-off method, and PZT/Ir patterning and Si patterning were performed by ICP (inductively coupled plasma) dry etching.

Note that while a piezoelectric cantilever can be fabricated by using a process of polishing and laminating bulk ceramic, it is advantageous in yield and cost to form a PZT thin film by using a direct film forming process typified by sputtering.

To implement the presently disclosed subject matter, Example 1 described above is not restrictive, and any material of the substrate, electrode material, piezoelectric material, film thickness, film forming conditions, and others can be selected as appropriate according to the purpose.

MODIFICATION EXAMPLE 1

While one actuator includes four cantilevers in the first embodiment, the number of cantilevers included in one actuator is not restricted to the number in this example, and may be further increased. However, if the number of cantilevers is increased, the resonance frequency is increased, and the device tends to become vulnerable to disturbance. Therefore, it is required to select the number of cantilevers for combination according to design requirements (according to the design of the resonance frequency in consideration of the use environment). Also, in view of cancelling of bending displacements in the same direction (cancelling of displacements in the same direction due to initial flexure caused by residual stress and DC offset), which will be described further below, it is required to fold and connect a plurality of piezoelectric cantilevers so that the fixing part of each actuator and the mirror support part are close to each other.

(Regarding Cancelling of Bending Displacements in Same Direction)

Figure 16:
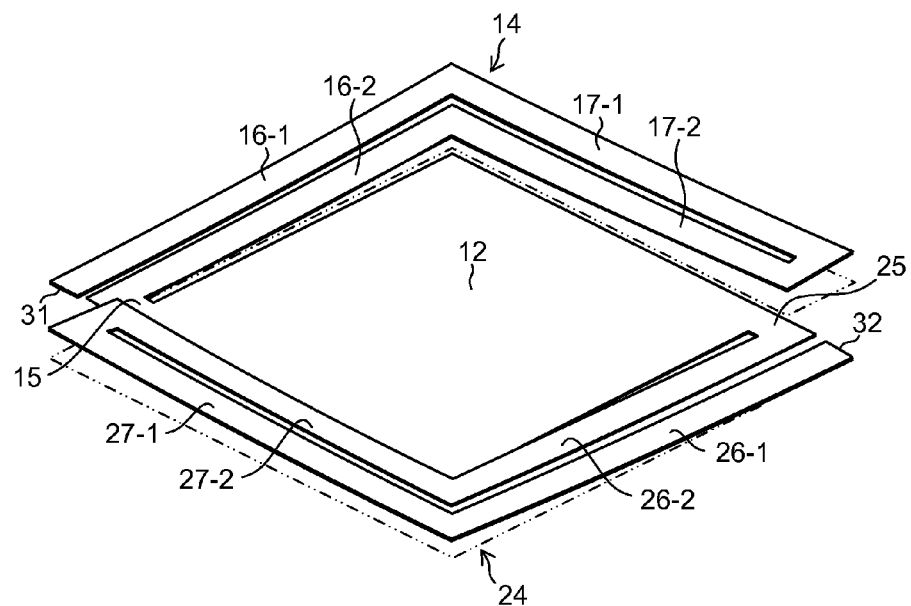
FIG. 16 is a perspective view of an example of a situation of deformation when a bending displacement occurs to all cantilevers in the same direction.

FIG. 16 is a perspective view of an example of a situation of deformation when a bending displacement occurs to all cantilevers in the same direction due to initial flexure caused by residual stress and DC offset. Here, the situation is illustrated in which a bending displacement with the lever part warping downward occurs to all cantilevers in the MEMS scanner device 10 according to the first embodiment. As already described, two actuators 14 and 24 placed so as to surround the mirror part 12 each have a structure in which a plurality of piezoelectric cantilevers are coupled together so as to be folded, and the cantilevers are connected together so as to be folded so that the fixing parts (31 and 32) of the actuators and the mirror support parts (15 and 25) are respectively close to each other. With this structure, bending displacements in the same direction are approximately cancelled, and a tilt displacement does not occur to the mirror part 12. This illustrates that there is no influence of a tilt displacement of the mirror when a waveform of DC offset application is inputted or when initial flexure caused by residual stress at the time of formation of the piezoelectric thin films occurs to a cantilever.

Nb-doped PZT has a piezoelectric constant approximately twice as large as the piezoelectric constant of non-doped PZT (intrinsic PZT) (by way of example, Nb-doped PZT has a d31 piezoelectric constant of approximately 250 μm/V), causing a large displacement. However, polarization reversal tends to occur, and the coercive filed is low (regarding this point, refer to "Solid State Communications 149 (2009) 1799 1802"). For this reason, to drive Nb-doped PZT, a contrivance is made such that an alternating waveform with a DC offset applied thereto is inputted to prevent an excess over the coercive field in the opposite direction. Also, Nb-doped PZT exhibits a residual stress higher than that of the non-doped PZT, and initial flexure is large.

From the above, the structure described in the first embodiment is a convenient structure for using Nb-doped PZT with a large amount of displacement.

(Regarding Resonance Mode)

Figure 17:
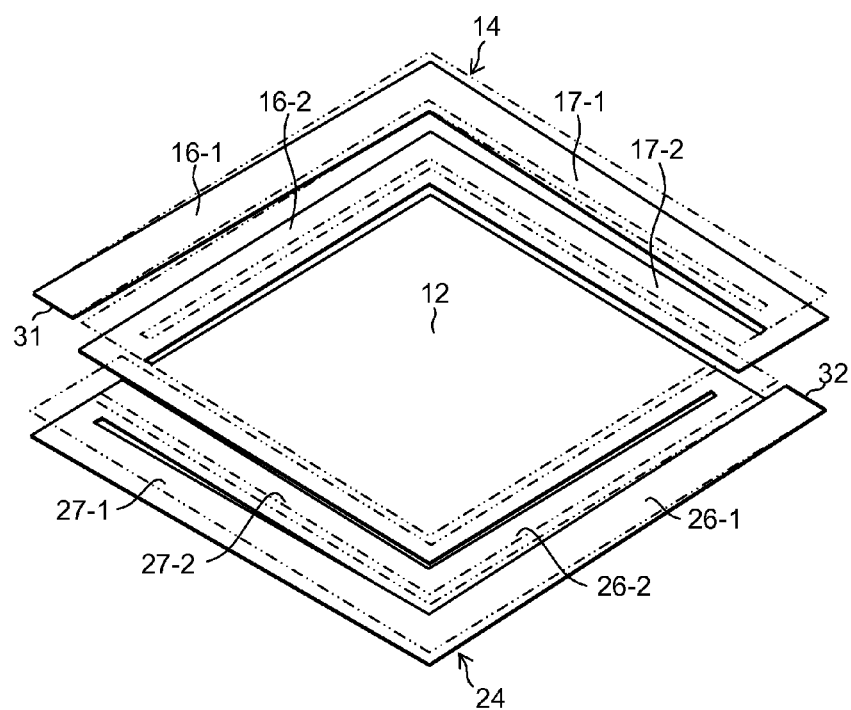
FIG. 17 is a perspective view of a motion in a primary resonance mode.
Figure 18:
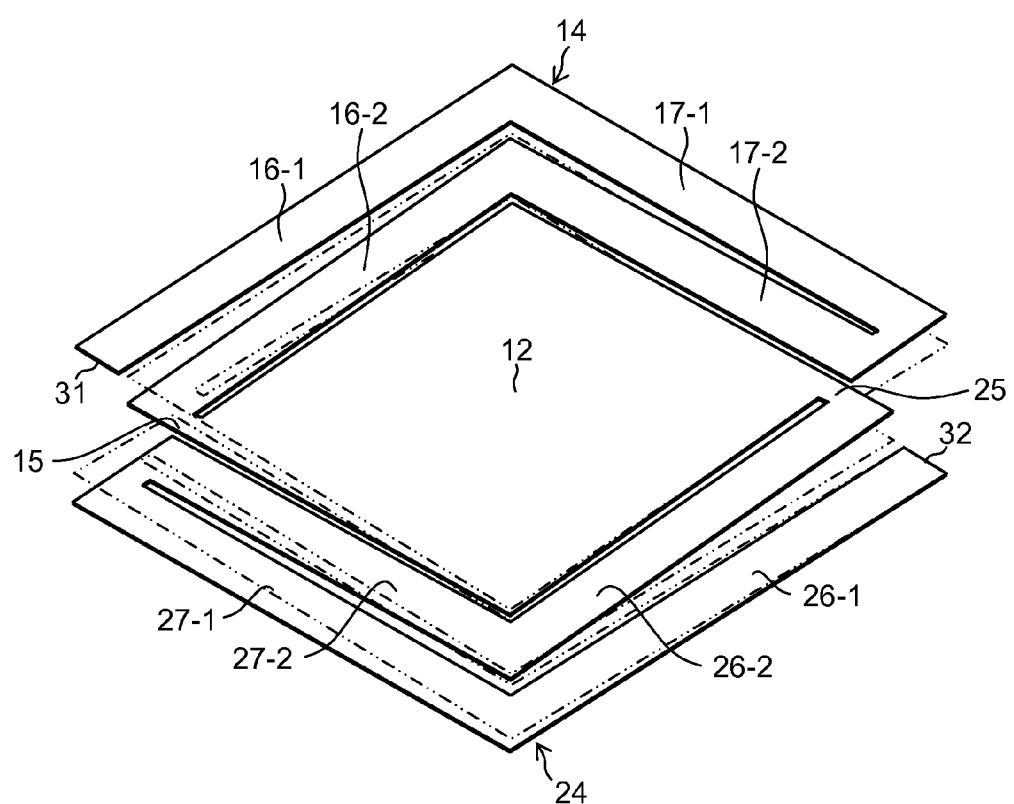
FIG. 18 is a perspective view of a motion in a secondary resonance mode.

Here, the motion of the MEMS scanner device 10 of the present embodiment in a resonance mode is described. The motion of the structure described in the first embodiment in a resonance mode is depicted in FIG. 17 and FIG. 18. FIG. 17 is a drawing in a primary resonance mode, and FIG. 18 is a drawing in a secondary resonance mode. The primary resonance mode (which is assumed to have a resonance frequency $f_1$) is a mode in which the mirror part 12 makes a translational motion in a vertical direction (a z direction). The secondary resonance mode (which is assumed to have a resonance frequency $f_2$) is a mode in which the mirror part makes a rotational motion.

As for the response speed of the tilt motion of the mirror part 12, the resonance frequency ($f_2$) in the secondary resonance mode is an upper limit. Also, when a translational motion of the mirror part 12 as observed in the primary resonance mode is excited by disturbance vibration, this causes fluctuations in optical path length. Therefore, in actual use, the device is designed so that $f_1$ is sufficiently higher than the frequency of disturbance vibration in the environment for the target use purpose. For example, in general, for the purpose of an automobile, the device is designed so that the resonance frequency is 500 Hz or higher. Also, for the purpose of a scanner (an optical scanner in an endoscope) or the like, disturbance is considered to be caused by human hand, and therefore the resonance frequency can be lower than the frequency for the purpose of an automobile, and the devise is preferably designed with approximately 300 Hz or higher. Note that since the response to vibrations from outside is inversely proportional to the square of the resonance frequency, the higher the resonance frequency, the more stable the device is for disturbance vibration.

[Second Embodiment]

Figure 19:
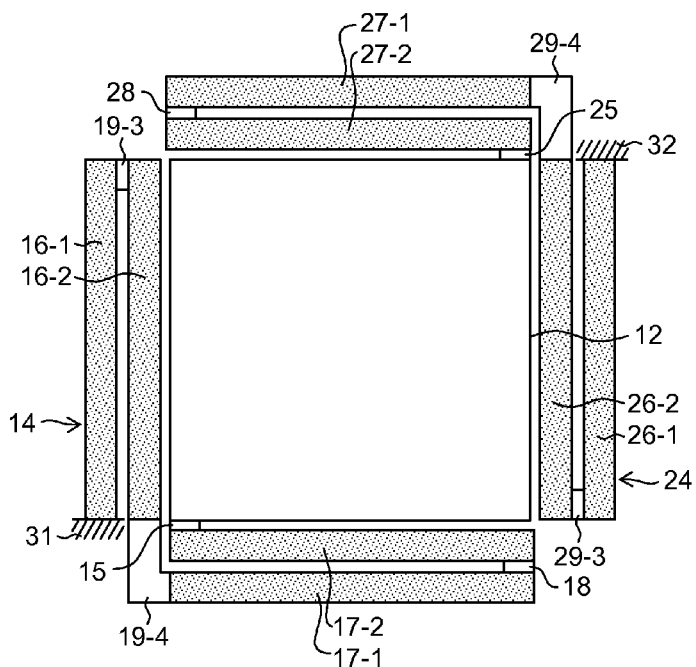
FIG. 19 is a schematic diagram of the structure of a MEMS scanner device according to a second embodiment.

FIG. 19 is a schematic diagram of the structure of a MEMS scanner device according to a second embodiment. In FIG. 19, elements identical or similar to those in the structure of the first embodiment described in FIG. 1 to FIG. 3 are provided with the same reference numerals and are not described herein.

Compared with the structure of FIG. 3, in the structure depicted in FIG. 19, the connecting order of the piezoelectric cantilevers in the first actuator 14 and the second actuator 24 is changed. As depicted in FIG. 19, piezoelectric cantilevers 16-1 and 16-2 for x axis rotation in this first actuator 14 are connected together via a coupling part 19-3 so as to be folded to a y axis direction, and the piezoelectric cantilevers 16-2 and a piezoelectric cantilever 17-1 for y axis rotation are connected together via a coupling part 19-4, and one end of the piezoelectric cantilever 17-2 is connected via the mirror support part 15 to the mirror part 12.

Similarly, piezoelectric cantilevers 26-1 and 26-2 for x axis rotation in the second actuator 24 are connected together via a coupling part 29-3 so as to be folded to a y axis direction, and the piezoelectric cantilevers 26-2 and a piezoelectric cantilever 27-1 for y axis rotation are connected together via a coupling part 29-4, and one end of the piezoelectric cantilever 27-2 is connected via the mirror support part 25 to the mirror part 12. Even with this structure, a mirror driving operation similar to that of the first embodiment can be performed.

As Example 2, the MEMS scanner device having the structure of the second embodiment (FIG. 19) was fabricated by using a manufacturing method similar to that of Example 1.

COMPARATIVE EXAMPLE

Figure 20:
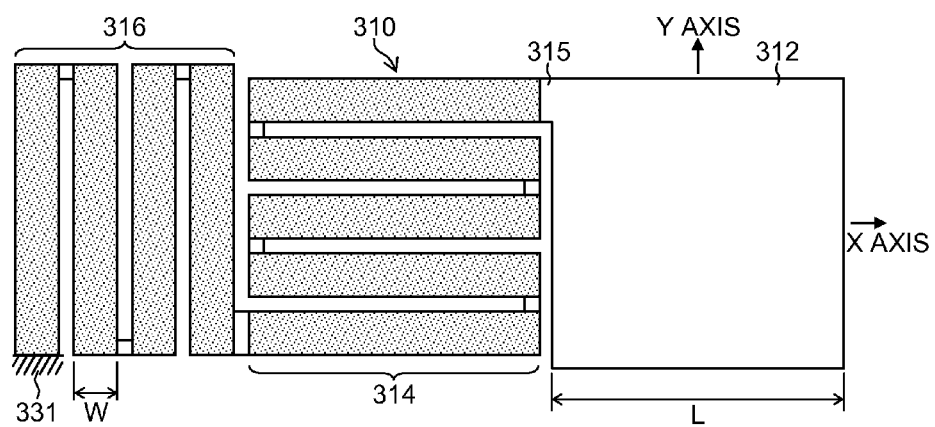
FIG. 20 is a schematic plan view of the structure of a MEMS scanner device according to Comparative Example.
Figure 26:
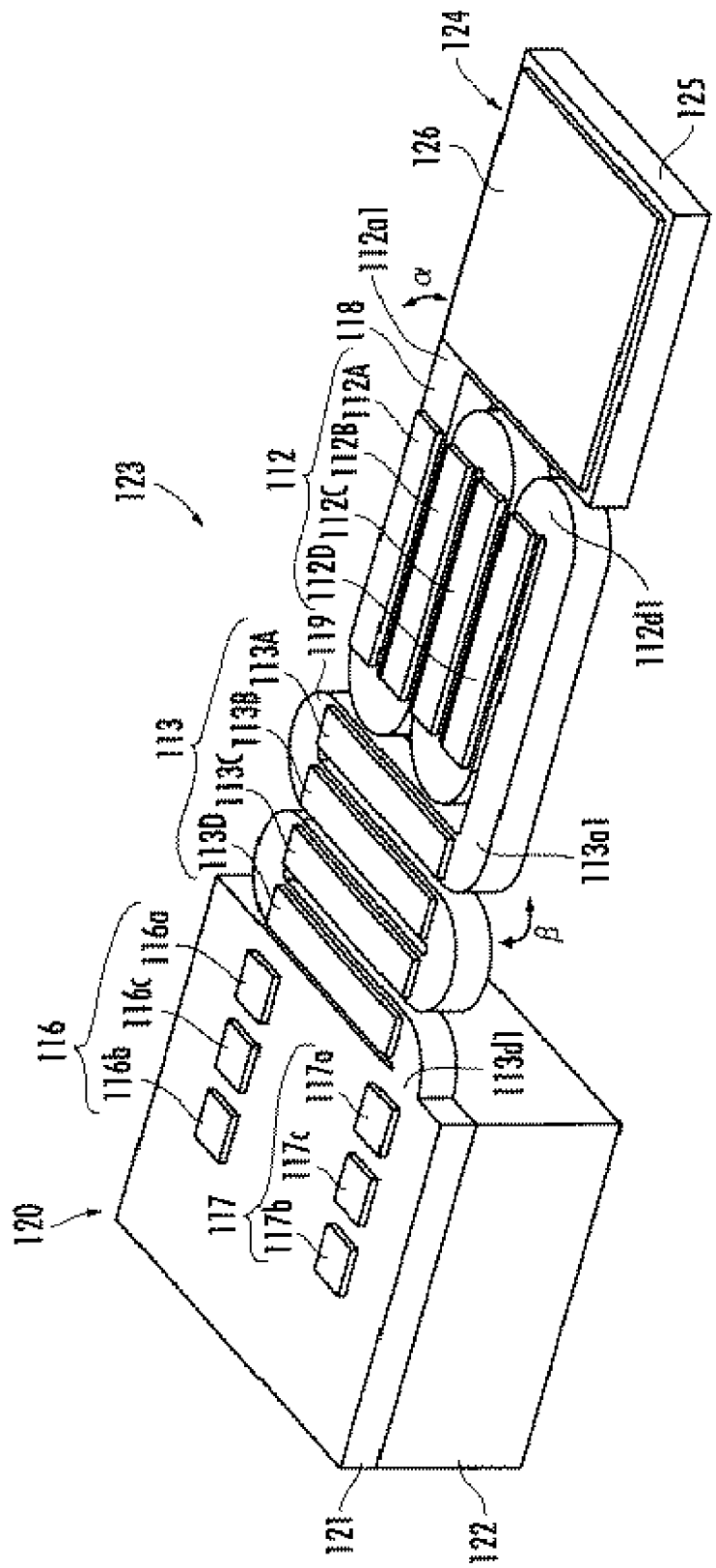
FIG. 26 is a perspective view of the structure of a conventional MEMS scanner device.

As Comparative Example, a device having a structure as depicted in FIG. 20 was fabricated. The structure depicted in FIG. 20 is based on the device structure depicted in FIG. 26 (the device structure disclosed in FIG. 3 of Japanese Patent Application Laid-Open No. 2008-040240). This MEMS scanner device 310 has a structure in which an actuator part 314 for y axis rotation and an actuator part 316 for x axis rotation are connected together to be placed on one side surface part of one side of a mirror part 312. The actuator parts (314 and 316) each have a structure in which a plurality of piezoelectric cantilevers are coupled together so as be folded.

In the structure as depicted in FIG. 20, since a fixing part 331 of the actuator and a mirror support part 115 are away from each other, an initial tilt occurs to the mirror part 312 due to initial warpage of the cantilevers or others. The element size is 3 mm wide×2 mm length. However, since the mirror part 312 is positioned at an end of the device, for example, for the endoscope purpose where the mirror part is placed at the center of a cylinder for use, for example, a necessary space is approximately twice as many as the device size. Furthermore, the structure of FIG. 20 has a problem in which the center of the mirror is moved with the rotation about the y axis.

<Outline of Device Evaluation Results>

In the structures of the first embodiment, the second embodiment, and Comparative Example, the results obtained by examining drive characteristics and resonance characteristics when the dimensions of the device is varied are depicted in FIG. 21. Here, characteristic evaluations were performed for the purpose of an endoscope. Specification requirements for the purpose of an endoscope are as follows, "AA" represents that four specification items are all satisfied, "A" represents that only three are satisfied, "B" represents that only two are satisfied, "C" represents that one or less is satisfied.

(Specification Requirements)

[1] The element size is smaller than 3×3 mm. This is required as a size allowing the device to be accommodated in an endoscope probe having a diameter of 5 millimeters (5 mm φ)

[2] The optical deflection angle due to application of a drive voltage (a potential difference) of ±10 V exceeds 20 degrees.

[3] The resonance frequency is higher than 300 Hz.

[4] The initial angle of the mirror is smaller than 2 degrees.

Note that a parameter L in the table of FIG. 21 represents the length of one side of the square-shaped mirror part 12 in a planar view (refer to FIG. 3 and FIG. 20). A parameter t represents the thickness of the piezoelectric thin film. A parameter w represents the thickness of the piezoelectric cantilever (the width in a short direction).

Regarding "*" in Comparative Example in the table, since the structure of Comparative Example is such that the distance from the center of the mirror to an end of the device is 2.3 mm at maximum, a space actually required for storing (accommodating) the device is 4 mm or larger, and therefore evaluations concluded that the specifications are not satisfied in view of accommodation in "an endoscope probe of 5 mm φ".

By combining Nb-doped PZT having a high piezoelectric constant and any of the structures described in the first embodiment and the second embodiment, a large angular displacement can be achieved while suppressing the number of times of folding of the cantilevers. With the decrease in the number of times of folding of the cantilevers and adoption of two actuators supporting diagonal angles of the mirror, the size of the element can be decreased and high resonance frequency can be obtained, thereby achieving a structure resistant to disturbance.

<Advantages According to Embodiments of the Presently Disclosed Subject Matter>

(1) By using Nb-doped PZT having excellent piezoelectric performance and the structure in which the piezoelectric cantilevers are folded, a large deflection angle can be obtained with a small number of times of folding. With this, the resonance frequency is increased, a quick response can be made, and the influences due to disturbance vibration can be significantly suppressed.

(2) Since two actuators 14 and 24 placed so as to surround the mirror part 12 support portions near approximately diagonal ends of the mirror part 12, even if disturbance vibrations in a direction perpendicular to the mirror occurs, no moment is exerted to the mirror, and thus the mirror does not rotate.

(3) Four piezoelectric cantilevers included in each of the actuators 14 and 24 are connected so as to be folded so that the fixing part (31, 32) of the actuator and the connecting part (the mirror support part 15, 25) with the mirror part 12 come close to each other. For this reason, even if warpage of the same phase occurs to all cantilevers due to initial warpage of the piezoelectric thin films or DC offset driving, displacements are all cancelled in the connecting part (the mirror support part 15, 25) with the mirror part 12, thereby not affecting the deflection angle of the mirror.

(4) Unlike the gimbal structure, every portion other than the mirror has a driving force as an actuator. Therefore, space use efficiency is high, and the element size is small. Also, since the motion of an actuator on a driving axis is not inhibited by an actuator on another axis, force use efficiency is high.

(5) The first actuator 14 and the second actuator 24 are placed so as to surround the mirror part as a center, and the shape has rotational symmetry at substantially 180 degrees (twice symmetry). Therefore, the device is suitable for being used also in an endoscope and others, and the mirror is less prone to be tilted with respect to outside vibration.

(6) The fixing parts, the piezoelectric actuator parts, the mirror part, the connecting parts (coupling parts) thereof, and others can be integrally formed by silicone processing.

(7) The size can be decreased compared with conventional polygon mirrors and galvanometer mirrors, and durability is high.

(8) As described in Example 1 and Example 2, a PZT thin film is directly formed on a substrate and is then subjected to dry etching process, thereby forming a MEMS scanner device. As such, by making the piezoelectric substance thinner, finer patterning can be easily performed. This can significantly improve yield and support a further decrease of the size of the device.

<Regarding the Shape of the Mirror Part>

Figure 22:
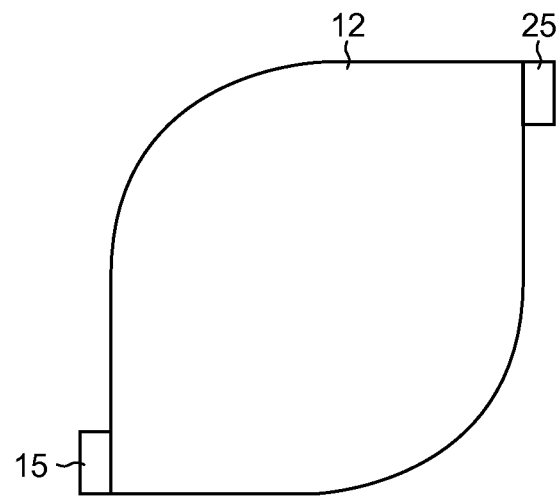
FIG. 22 is a plan view of another example of the shape of the mirror part.
Figure 23:
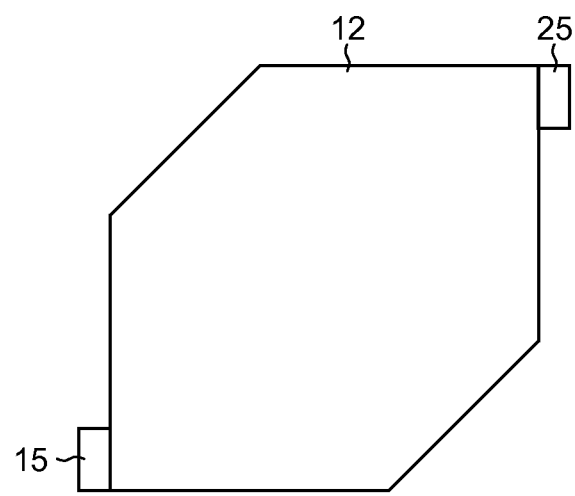
FIG. 23 is a plan view of still other example of the shape of the mirror part.

The mirror part 12 may have any shape other than a rectangle. For example, shapes as depicted in FIG. 22 and FIG. 23 are possible. As exemplarily depicted in these drawings, by adopting a shape with corners at diagonal angles other than the mirror support parts 15 and 25 being rounded (FIG. 22) or a shape with the corners mentioned above being beveled (FIG. 23), the weight of the mirror part may be reduced. As such, by making the shape lighter than the rectangle, the resonance frequency can be increased to some degree.

However, in the case of driving about two axes orthogonal to each other (the x axis and the y axis), it is desired to set the mirror support parts 15 and 25, each of which is a joint part between the actuator and the mirror, at diagonal angles close to those when the mirror has a rectangular shape.

<Regarding Two Rotation Axes>

Figure 24:
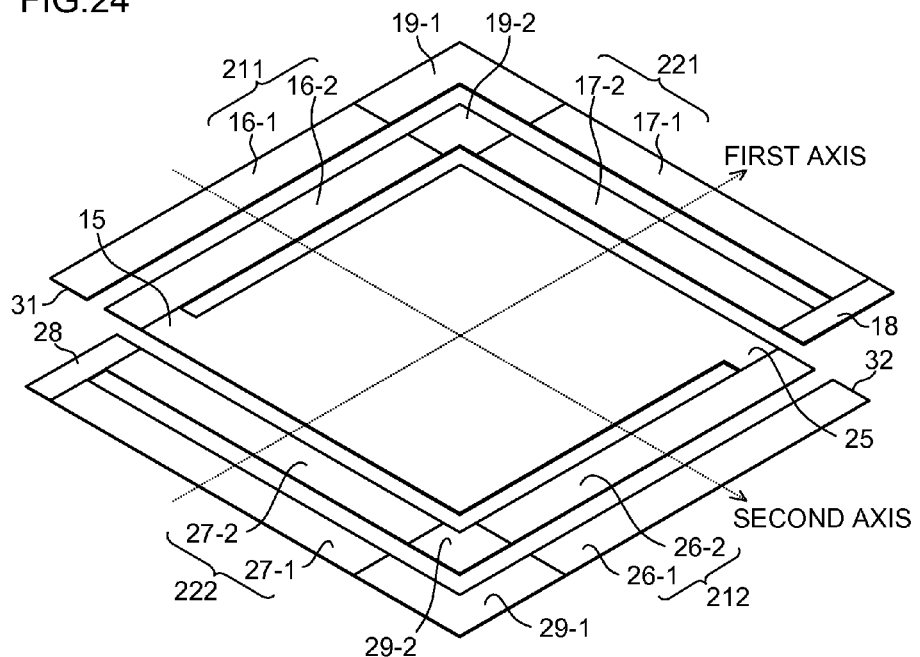
FIG. 24 is a schematic plan view of the structure of a MEMS scanner device according to a third embodiment.

FIG. 24 is a schematic plan view of the structure of a MEMS scanner device 200 according to a third embodiment. In FIG. 24, elements identical or similar to those in the structure of the first embodiment described in FIG. 1 to FIG. 3 are provided with the same reference numerals. While the x axis and the y axis orthogonal to each other are exemplarily described as rotation axes in the first embodiment and the second embodiment, two rotation axes are not necessarily required to be orthogonal to each other. For example, as in FIG. 24, a first axis and a second axis can be (non-parallel) axes crossing at an appropriate angle. That is, as in FIG. 24, piezoelectric cantilevers 16-1, 16-2, 26-1, and 26-2 included in actuator elements 211 and 212 for second axis rotation and piezoelectric cantilevers 17-1, 17-2, 27-1, and 27-2 included in actuator elements 221 and 222 for first axis rotation are connected together without making their longitudinal directions cross each other. With this, the mirror part 12 can rotate about two axes (the first axis and the second axis) not orthogonal to each other.

However, as described in the first embodiment and the second embodiment, if the mirror can be rotated about two axes (the x axis and the y axis) orthogonal to each other, the rotation axes can be synthesized, and therefore rotation about all axes in an x-y plane can be made.

<Regarding the Number of Times of Folding of the Piezoelectric Cantilever>

Figure 25:
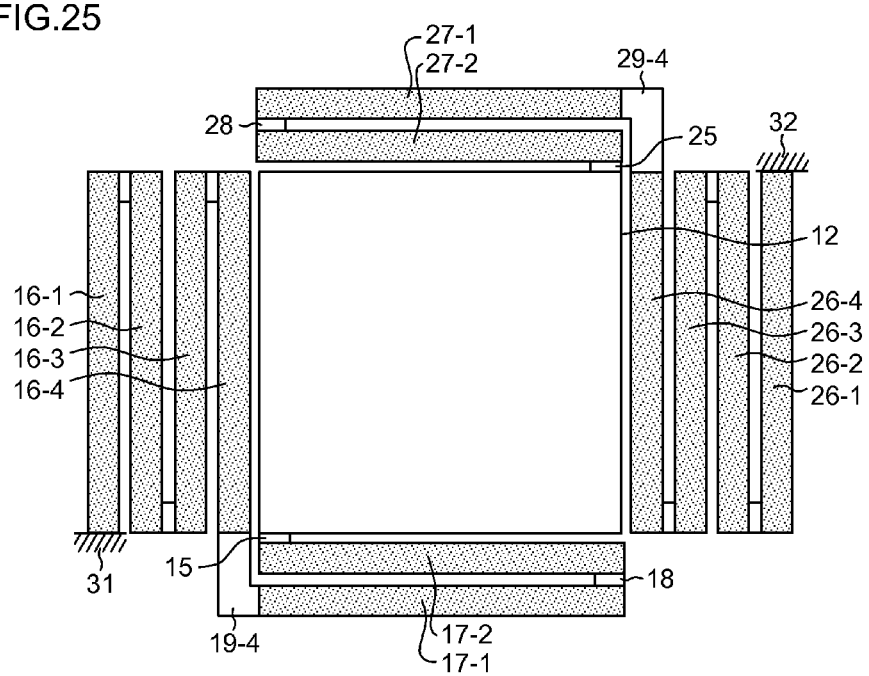
FIG. 25 is a schematic plan view of another embodiment in which the number of times of folding of a piezoelectric cantilever is changed.

While the number of folded piezoelectric cantilevers included in one actuator may be any, it is required to fold so that the fixing part of the actuator and the mirror support part are close to each other. For example, the number of times of folding can be changed as depicted in FIG. 25. In FIG. 25, structures identical or similar to those of FIG. 19 are provided with the same reference numeral and are not described herein.

To fold the cantilevers so that the fixing part (31 and 32) of the actuator and the mirror support part (15 and 25) are close to each other, respectively, the number of piezoelectric cantilevers included in the actuator element for x axis (second axis) rotation and the number of piezoelectric cantilevers included in the actuator element for y axis (first axis) rotation are each an even number. The number of piezoelectric cantilevers included in the actuator element for x axis (second axis) rotation and the number of piezoelectric cantilevers included in the actuator element for y axis (first axis) rotation are not necessarily equal to each other.

If the number of piezoelectric cantilevers is large, the displacement angle is increased, but the resonance frequency is decreased. Therefore, it is required to determine the number of times of folding according to a necessary angle and resonance frequency. As a guide, a resonance frequency less prone to be influenced by disturbance vibration is 300 Hz or higher. If Nb-doped PZT with a high piezoelectric constant is used, a large displacement can be obtained with a relatively small number of piezoelectric cantilevers, and therefore the resonance frequency can also be increased.

As described in the first embodiment and the second embodiment, the simplest structure is such that the number of piezoelectric cantilevers included in the actuator element for x axis (second axis) rotation and the number of piezoelectric cantilevers included in the actuator element for y axis (first axis) rotation are two each.

<Examples of Application>

The presently disclosed subject matter can be used for various use purposes as an optical device that reflects light such as laser light to change a light traveling direction. For example, the presently disclosed subject matter can be widely applied to optical deflectors, optical scanners, laser printers, bar code readers, display devices, various optical sensors (distance-measuring sensors and shape-measuring sensors), optical communication devices, laser projectors, OCT (optical coherence tomography) diagnostic imaging devices, and others.

Note that the presently disclosed subject matter is not restricted to the embodiments described above, and can be variously modified by a person who has common knowledge in the field within technical idea of the presently disclosed subject matter.

<Regarding Disclosed Modes of the Presently Disclosed Subject Matter>

As can be understood from the description of the embodiments of the presently disclosed subject matter described in detail above, the specification includes the disclosure of various technical ideas including at least aspects described below.

(First Aspect)

A mirror driving device includes a mirror part having a reflection surface configured to reflect light, mirror support parts formed at portions of the mirror part diagonal to each other, and a first actuator and a second actuator placed so as to surround the mirror part, wherein the first actuator and the second actuator each have a structure in which a plurality of first piezoelectric cantilevers with a longitudinal direction oriented to a direction of a first axis and a plurality of second piezoelectric cantilevers with a longitudinal direction oriented to a second axis are coupled together so as to be folded, and each of first actuator and the second actuator has one end connected to the mirror part via a relevant one of the mirror support parts and another end connected to a fixing part near the mirror support part to which the one end is coupled.

According to this aspect, by accumulating displacements of the plurality of piezoelectric cantilevers, the mirror part can be tilted at a large deflection angle.

Furthermore, even if warpage in the same direction occurs to all piezoelectric cantilevers due to initial warpage of the piezoelectric substance configuring the actuator caused by residual stress, offset driving, or other reason, these displacements are all cancelled, and hardly affect the deflection angle of the mirror part. Also, according to the presently disclosed subject matter, space use efficiency is high, and a reduction of the element size can be achieved.

(Second Aspect)

In the mirror driving device according to the first aspect, the plurality of first piezoelectric cantilevers and the plurality of second piezoelectric cantilevers can have a structure of being coupled so as to be folded so that the mirror support part to which the one end is coupled and the fixing part to which another end is coupled are close to each other within a range of a width dimension in a second axis direction of actuator elements for second axis rotation configured of the plurality of first piezoelectric cantilevers.

It is desirable that the fixing part and the mirror support part are positioned as closely as possible. However, due to structural restrictions of the actuator formed by combining a plurality of piezoelectric cantilevers and other reasons, the range of proximity has an allowance range to some degree.

(Third Aspect)

In the mirror driving device according to the first aspect or the second aspect, the first piezoelectric cantilevers and the second piezoelectric cantilever each can perform a bending displacement due to piezoelectric deformation caused by application of a voltage to a piezoelectric substance, the plurality of first piezoelectric cantilevers can function as the actuator elements for second axis rotation configured to rotate the mirror part about the second axis, and the plurality of second piezoelectric cantilevers can function as actuator elements for first axis rotation configured to rotate the mirror part about a first axis.

(Fourth Aspect)

In the mirror driving device according to any one of the first aspect to the third aspect, adjacent cantilevers among the plurality of first piezoelectric cantilevers can be driven to cause bending displacements in opposite directions, adjacent cantilevers among the plurality of second piezoelectric cantilevers can be driven to cause bending displacements in opposite directions, and the first actuator and the second actuator can be driven so as to each transmit an angular displacement in an opposite direction to the relevant one of the mirror support parts to which the actuator is connected.

With this aspect, displacements of the respective cantilevers are added, thereby allowing a large angular displacement to be obtained.

(Fifth Aspect)

In the mirror driving device according to any one of the first aspect to the fourth aspect, the device can further include a drive voltage supply circuit configured to supply a drive voltage to the first piezoelectric cantilevers and the second piezoelectric cantilevers, wherein the drive voltage supply circuit supplies the drive voltage to the plurality of first piezoelectric cantilevers and the plurality of second piezoelectric cantilevers so as to cause bending displacements in opposite directions to adjacent cantilevers of among the plurality of first piezoelectric cantilevers, cause bending displacements in opposite directions to adjacent cantilevers of among the plurality of second piezoelectric cantilevers, and cause the first actuator and the second actuator to each transmit an angular displacement in an opposite direction to a relevant one of the mirror support parts to which a relevant one of the first actuator and the second actuator is connected.

According to this aspect, a large displacement can be obtained even without using resonance.

(Sixth Aspect)

In the mirror driving device according to any one of the first aspect to the fifth aspect, the first piezoelectric cantilevers and the second piezoelectric cantilevers each can have a unimorph cantilever structure with a laminated structure in which a diaphragm, a lower electrode, a piezoelectric substance, and an upper electrode are sequentially laminated.

While the piezoelectric cantilever can have not only a unimorph structure but also a bimorph structure, the unimorph structure is the simplest structure.

(Seventh Aspect)

In the mirror driving device according to any one of the first aspect to the sixth aspect, a piezoelectric substance for use in the first actuator and the second actuator can be one type or two or more of perovskite-type oxide represented by a following formula (P):

A general formula ABO₃      (P)

(where A: at least one type of A site element containing Pb;

B: at least one type of B site element selected from the group comprising Ti, Zr, V, Nb, Ta, Sb, Cr, Mo, W, Mn, Sc, Co, Cu, In, Sn, Ga, Zn, Cd, Fe, and Ni;

O: oxygen element; and while the A site element, the B site element, and the oxygen element are in a molar ratio of 1:1:3 as a standard molar ratio, a tolerance can exist between a molar ratio of the A site element, the B site element, and the oxygen element and the standard molar ratio as long as a perovskite structure can be taken).

(Eighth Aspect)

In the mirror driving device according to any one of the first aspect to the sixth aspect, a piezoelectric substance for use in the first actuator and the second actuator is preferably one type or two or more of perovskite-type oxide represented by the following formula (PX):

$A_a(Zr_x,Ti_y,M_{b-x-y})_bO_c$      (PX)

(where A: at least one type of A site element containing Pb;

M: at least one type of element selected from the group comprising V, Nb, Ta, and Sb;

0<x<b, 0<y<b, 0<b-x-y; and while a, b, and c are in a molar ratio of 1:1:3 as a standard molar ratio, a tolerance can exist between a molar ratio: a:b:c and the standard molar ratio as long as a perovskite structure can be taken).

This piezoelectric substance has excellent piezoelectric characteristics, and is preferable as a piezoelectric actuator part. By using a material with excellent piezoelectric characteristics, a large deflection angle can be obtained even if the number of times of folding of the cantilevers is small, and therefore the resonance frequency can be designed to be high. With this, a quick response can be made, and an influence due to disturbance vibration can be significantly suppressed.

(Ninth Aspect)

In the mirror driving device according to any one of the first aspect to the eighth aspect, the piezoelectric substance for use in the first actuator and the second actuator can be a thin film having a thickness of 1 μm to 10 μm, the thin film directly formed on a substrate as a diaphragm.

The piezoelectric actuator is preferably configured by using a thin film piezoelectric substance. By using chemical vapor deposition typified by sputtering or direct film forming method such as a sol-gel process, a piezoelectric thin film having necessary piezoelectric performance can be obtained.

(Tenth Aspect)

In the mirror driving device according to the ninth aspect, the thin film of the piezoelectric substance can be formed by sputtering.

(Eleventh Aspect)

In the mirror driving device according to any one of the first aspect to the tenth aspect, the drive voltage to be applied to an upper electrode of each of the first piezoelectric cantilevers and the second piezoelectric cantilevers is preferably a voltage of a coercive field on a plus side or lower.

With this, polarization reversal of the piezoelectric substance can be avoided, and stable driving can be performed.

(Twelfth Aspect)

In the mirror driving device according to any one of the first aspect to the eleventh aspect, a lowest resonance frequency is preferably 300 Hz or more.

With this, the structure is less prone to be influenced by vibration due to disturbance.

(Thirteenth Aspect)

In the mirror driving device according to any one of the first aspect to the twelfth aspect, the first actuator and the second actuator can each have a structure in which two of the first piezoelectric cantilevers and two of the second piezoelectric cantilevers are coupled to each other.

This structure is the simplest structure, and also it is possible to design the resonance frequency at a high value.

(Fourteenth Aspect)

A method of controlling the mirror driving device according to any one of the first aspect to the thirteenth aspect includes causing bending displacements in opposite directions to adjacent cantilevers of the plurality of first piezoelectric cantilevers, causing bending displacements in opposite directions to adjacent cantilevers of the plurality of second piezoelectric cantilevers, and performing control of supplying a drive voltage to the first piezoelectric cantilevers and the second piezoelectric cantilevers of each of the first actuator and second actuator so that angular displacements at ends of the respective first and second piezoelectric cantilevers are added and transmitted to the mirror support parts and that the first actuator and the second actuator each transmit an angular displacement in an opposite direction to a relevant one of the mirror support parts.

What is claimed is:

1. A mirror driving device comprising:
   a mirror part having a reflection surface configured to reflect light;
   mirror support parts formed at portions of the mirror part diagonal to each other; and
   a first actuator and a second actuator placed so as to surround the mirror part,
   wherein the first actuator and the second actuator each have a structure in which a plurality of first piezoelectric cantilevers with a longitudinal direction oriented to a direction of a first axis and a plurality of second piezoelectric cantilevers with a longitudinal direction oriented to a second axis are coupled together so as to be folded, and
   each of the first actuator and the second actuator has one end connected to the mirror part via a relevant one of the mirror support parts and another end connected to a fixing part near the mirror support part to which the one end is coupled,
   the plurality of first piezoelectric cantilevers and the plurality of second piezoelectric cantilevers having a structure of being coupled so as to be folded so that the mirror support part to which the one end is coupled and the fixing part to which another end is coupled are close to each other within a range of a width dimension in a second axis direction of actuator elements for second axis rotation configured of the plurality of first piezoelectric cantilevers.

2. The mirror driving device according to claim 1, wherein
   the first piezoelectric cantilevers and the second piezoelectric cantilevers each perform a bending displacement due to piezoelectric deformation caused by application of a voltage to a piezoelectric substance,
   the plurality of first piezoelectric cantilevers function as the actuator elements for second axis rotation configured to rotate the mirror part about the second axis, and
   the plurality of second piezoelectric cantilevers function as actuator elements for first axis rotation configured to rotate the mirror part about a first axis.

3. The mirror driving device according to claim 1, wherein
   adjacent cantilevers among the plurality of first piezoelectric cantilevers are driven to cause bending displacements in opposite directions,
   adjacent cantilevers among the plurality of second piezoelectric cantilevers are driven to cause bending displacements in opposite directions, and
   the first actuator and the second actuator are driven so as to each transmit an angular displacement in an opposite direction to the relevant one of the mirror support parts to which the actuator is connected.

4. The mirror driving device according to claim 1, further comprising
   a drive voltage supply circuit configured to supply a drive voltage to the first piezoelectric cantilevers and the second piezoelectric cantilevers, wherein
   the drive voltage supply circuit supplies the drive voltage to the plurality of first piezoelectric cantilevers and the plurality of second piezoelectric cantilevers so as to
   cause bending displacements in opposite directions to adjacent cantilevers of among the plurality of first piezoelectric cantilevers,
   cause bending displacements in opposite directions to adjacent cantilevers of among the plurality of second piezoelectric cantilevers, and
   cause the first actuator and the second actuator to each transmit an angular displacement in an opposite direction to a relevant one of the mirror support parts to which a relevant one of the first actuator and the second actuator is connected.

5. The mirror driving device according to claim 1, wherein the first piezoelectric cantilevers and the second piezoelectric cantilevers each has a unimorph cantilever structure with a laminated structure in which a diaphragm, a lower electrode, a piezoelectric substance, and an upper electrode are sequentially laminated.

6. The mirror driving device according to claim 1, wherein
   a piezoelectric substance for use in the first actuator and the second actuator is one type or two or more of perovskite-type oxide represented by a following formula (P):
   A general formula $ABO_3$ (P) (where A: at least One type of A site element containing Pb;
   B: at least one type of B site element selected from the group comprising Ti, Zr, V, Nb, Ta, Sb. Cr, Mo, W, Mn, Sc, Co, Cu, In, Sn. Ga, Zn, Cd, Fe, and Ni;
   O): oxygen element; and
   while the A site clement, the B site element, and the oxygen element are in a molar ratio of 1:1:3 as a standard molar ratio, a tolerance exists between a molar ratio of the A site element, the B site element, and the oxygen element and the standard molar ratio as long as a perovskite structure is taken).

7. The mirror driving device according to claim 1, wherein
   a piezoelectric substance for use in the first actuator and the second actuator is one type or two or more of perovskite-type oxide represented by the following formula (PX):

$$A_a(Zr_x, Ti_y, M_{b-x-y})_b O_c \quad (PX)$$

(where A: at least one type of A site element containing Pb;
   M: at least one type of element selected from the group comprising V, Nb, Ta, and Sb;
   $0<x<b$, $0<y<b$, $0<b-x-y$; and
   while a, b, and c are in a molar ratio of 1:1:3 as a standard molar ratio, a tolerance exists between a molar ratio: a:b:c and the standard molar ratio as long as a perovskite structure is taken).

8. The mirror driving device according to claim 1, wherein
   the piezoelectric substance for use in the first actuator and the second actuator is a thin film having a thickness of 1 μm to 10 μm, the thin film directly formed on a substrate as a diaphragm.

9. The mirror driving device according to claim 8, wherein the thin film of the piezoelectric substance is formed by sputtering.

10. The mirror driving device according to claim 1, wherein
    the drive voltage to be applied to an upper electrode of each of the first piezoelectric cantilevers and the second piezoelectric cantilevers is a voltage of a coercive field on a plus side or lower.

11. The mirror driving device according to claim 1, wherein
    a lowest resonance frequency is 300 Hz or more.

12. The mirror driving device according to claim 1, wherein
    the first actuator and the second actuator each have a structure in which two of the first piezoelectric cantilevers and two of the second piezoelectric cantilevers are coupled to each other.

13. A method of controlling the mirror driving device according to claim 1, the method comprising:
- causing bending displacements in opposite directions to adjacent cantilevers among the plurality of first piezoelectric cantilevers;
- causing bending displacements in opposite directions to adjacent cantilevers among the plurality of second piezoelectric cantilevers; and
- performing control of supplying a drive voltage to the first piezoelectric cantilevers and the second piezoelectric cantilevers of each of the first actuator and second actuator so that angular displacements at ends of the respective first and second piezoelectric cantilevers are added and transmitted to the mirror support parts and that the first actuator and the second actuator each transmit an angular displacement in an opposite direction to a relevant one of the mirror support parts.

* * * * *